US011450545B2

(12) United States Patent
Sun et al.

(10) Patent No.: US 11,450,545 B2
(45) Date of Patent: Sep. 20, 2022

(54) CAPACITIVELY-COUPLED PLASMA SUBSTRATE PROCESSING APPARATUS INCLUDING A FOCUS RING AND A SUBSTRATE PROCESSING METHOD USING THE SAME

(71) Applicant: Samsung Electronics Co., Ltd., Suwon-si (KR)

(72) Inventors: Jongwoo Sun, Hwaseong-si (KR); Incheol Song, Hwaseong-si (KR); Hongmin Yoon, Hwaseong-si (KR); Jihyun Lim, Seoul (KR); Masayuki Tomoyasu, Seongnam-si (KR); Jewoo Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 188 days.

(21) Appl. No.: 16/683,707

(22) Filed: Nov. 14, 2019

(65) Prior Publication Data

US 2020/0335376 A1     Oct. 22, 2020

(30) Foreign Application Priority Data

Apr. 17, 2019  (KR) ................. 10-2019-0044635
Aug. 2, 2019   (KR) ................. 10-2019-0094175

(51) Int. Cl.
*H01L 21/683* (2006.01)
*H01J 37/32* (2006.01)

(52) U.S. Cl.
CPC .... *H01L 21/6833* (2013.01); *H01J 37/32091* (2013.01); *H01J 37/32568* (2013.01);
(Continued)

(58) Field of Classification Search
None
See application file for complete search history.

(56) References Cited

U.S. PATENT DOCUMENTS 7,882,800 B2    2/2011   Koshiishi et al.
8,512,510 B2    8/2013   Koshiishi et al.
(Continued)

FOREIGN PATENT DOCUMENTS

JP       3192370 B2      5/2001
JP    2003-257935 A      9/2003
(Continued)

OTHER PUBLICATIONS

Machine Translation JP2003257935, Tawara et al (Year: 2003).*
Machine Translation JP2007048826, Yoshimori (Year: 2007).*

*Primary Examiner* — Ram N Kackar
*Assistant Examiner* — Laureen Chan
(74) *Attorney, Agent, or Firm* — Muir Patent Law, PLLC

(57) ABSTRACT

According to some embodiments, a semiconductor substrate processing apparatus includes a housing, a plasma source unit, an electrostatic chuck, and a ring unit. The housing encloses a process chamber. The plasma source unit is connected to the housing, and includes a shower head and a fixing ring positioned to support the shower head. The shower head includes an upper electrode mounted on the fixing ring, and includes injection holes passing through part of the upper electrode and configured to inject gas into the chamber. The electrostatic chuck is connected to the housing and includes a lower electrode, and is for mounting a semiconductor substrate thereon. The ring unit is mounted on an edge portion of the electrostatic chuck, and includes a focus ring and a cover ring surrounding the focus ring. One of the lower electrode and the upper electrode is connected to a high frequency power supply, and the other of the lower electrode and the upper electrode is connected to ground. The focus ring has an inner side surface, and an opposite outer side surface that contacts the cover ring, and a width between the inner side surface and the outer side surface of the focus ring is a first width. The cover ring has an inner
(Continued)

side surface that contacts the outer side surface of the focus ring, and an outer side surface, and a width between the inner side surface and the outer side surface of the cover ring is a second width. The first width is between 2 and 10 time the second width.

14 Claims, 15 Drawing Sheets

(52) U.S. Cl.
CPC .. *H01J 37/32642* (2013.01); *H01J 37/32715* (2013.01); *H01J 2237/2007* (2013.01); *H01J 2237/334* (2013.01)

(56) References Cited

U.S. PATENT DOCUMENTS

| | | | | |
|---|---|---|---|---|
| 2004/0074605 A1* | 4/2004 | Nezu | ............. | H01J 37/32623 156/345.47 |
| 2005/0005859 A1* | 1/2005 | Koshiishi | ......... | H01J 37/32642 118/728 |
| 2005/0042881 A1* | 2/2005 | Nishimoto | ....... | H01L 21/67248 438/710 |
| 2006/0170078 A1* | 8/2006 | Moriya | ............. | H01L 21/3225 257/655 |
| 2007/0169891 A1* | 7/2007 | Koshiishi | ......... | H01L 21/68735 156/345.47 |
| 2007/0215279 A1* | 9/2007 | Koshiishi | ......... | H01J 37/32642 156/345.3 |
| 2009/0078196 A1* | 3/2009 | Midorikawa | ..... | H01L 21/30655 118/708 |
| 2010/0300622 A1* | 12/2010 | Yatsuda | ............ | H01J 37/32642 156/345.44 |
| 2010/0326957 A1* | 12/2010 | Maeda | .............. | H01J 37/32642 216/67 |
| 2011/0070743 A1* | 3/2011 | Dhindsa | ............ | H01J 37/32091 438/725 |
| 2011/0126984 A1* | 6/2011 | Kang | ................ | H01J 37/32091 156/345.51 |
| 2013/0284371 A1* | 10/2013 | Matsumoto | ....... | H01J 37/32082 156/345.28 |
| 2014/0251956 A1* | 9/2014 | Jeon | .................. | H01J 37/32577 216/71 |
| 2015/0245460 A1* | 8/2015 | Yoshida | ................... | H05B 7/18 373/22 |
| 2016/0284522 A1 | 9/2016 | Eto et al. | | |
| 2016/0351378 A1 | 12/2016 | Kishi et al. | | |
| 2017/0236741 A1 | 8/2017 | Angelov et al. | | |
| 2017/0330728 A1 | 11/2017 | Bravo et al. | | |
| 2019/0228952 A1* | 7/2019 | Dorf | ................... | H01L 21/6831 |

FOREIGN PATENT DOCUMENTS

| | | |
|---|---|---|
| JP | 4675182 B2 | 2/2011 |
| JP | 5227197 B2 | 3/2013 |
| KR | 10-2007-0054766 A | 5/2007 |
| KR | 10-2017-0095137 A | 8/2017 |
| KR | 10-2017-0127358 A | 11/2017 |

* cited by examiner (4)

(5)

CAPACITIVELY-COUPLED PLASMA SUBSTRATE PROCESSING APPARATUS INCLUDING A FOCUS RING AND A SUBSTRATE PROCESSING METHOD USING THE SAME

CROSS-REFERENCE TO THE RELATED APPLICATION

This U.S. non-provisional patent application claims priority under 35 U.S.C. § 119 to and the benefit of Korean Patent Application No. 10-2019-0094175, filed on Aug. 2, 2019, and Korean Patent Application No. 10-2019-0044635, filed on Apr. 17, 2019, both filed in the Korean Intellectual Property Office (KIPO), and the disclosure of each of which application is incorporated herein by reference in its entirety.

BACKGROUND

1. Field

Apparatuses and methods consistent with exemplary embodiments relate to a capacitively coupled plasma substrate processing apparatus and a substrate processing method using the same.

2. Description of Related Art

As semiconductor devices become more sophisticated, demand for high aspect ratio pattern structures increases. And as the substrates become larger, etch defects occur in the edge region of the substrate even with minute uniformity change of the plasma. As a result, a yield of the substrate edge region in a plasma etching process is significantly reduced. Accordingly, a new plasma etching apparatus that can increase the uniformity of the plasma is desirable.

SUMMARY

Some example embodiments of the inventive concept are directed to providing a capacitively coupled plasma substrate processing apparatus for increasing process speed and production yield by uniformly dispersing plasma density in a plasma process for processing a semiconductor substrate using plasma and a substrate processing method using the same.

According to some embodiments, a semiconductor substrate processing apparatus includes a housing, a plasma source unit, an electrostatic chuck, and a ring unit. The housing encloses a process chamber. The plasma source unit is connected to the housing, and includes a shower head and a fixing ring positioned to support the shower head. The shower head includes an upper electrode mounted on the fixing ring, and includes injection holes passing through part of the upper electrode and configured to inject gas into the chamber. The electrostatic chuck is connected to the housing and includes a lower electrode, and is for mounting a semiconductor substrate thereon. The ring unit is mounted on an edge portion of the electrostatic chuck, and includes a focus ring and a cover ring surrounding the focus ring. One of the lower electrode and the upper electrode is connected to a high frequency power supply, and the other of the lower electrode and the upper electrode is connected to ground. The focus ring has an inner side surface, and an opposite outer side surface that contacts the cover ring, and a width between the inner side surface and the outer side surface of the focus ring is a first width. The cover ring has an inner side surface that contacts the outer side surface of the focus ring, and an outer side surface, and a width between the inner side surface and the outer side surface of the cover ring is a second width. The first width is between 2 and 10 time the second width.

According to some embodiments, a semiconductor substrate processing apparatus includes a housing, a plasma source unit, an electrostatic chuck, and a ring unit. The housing encloses a process chamber. The plasma source unit is connected to the housing, and includes a shower head and a fixing ring positioned to support the shower head. The shower head includes an upper electrode mounted on the fixing ring, and includes injection holes passing through part of the upper electrode and configured to inject gas into the chamber. The electrostatic chuck is connected to the housing and includes a lower electrode, and is for mounting a semiconductor substrate thereon. The ring unit is mounted on an edge portion of the electrostatic chuck, and includes a focus ring and a cover ring surrounding the focus ring. One of the lower electrode and the upper electrode is connected to a high frequency power supply, and the other of the lower electrode and the upper electrode is connected to ground. The focus ring has a two-layer structure that includes a doped silicon layer as an upper layer having a first thickness and an Al2O3 layer as a lower layer having a second thickness, and the ratio of the first thickness to the second thickness is between 3:1 and 3:2.

According to some embodiments, a method of manufacturing a semiconductor device on a semiconductor substrate uses a plasma processing apparatus. The plasma processing apparatus includes a housing enclosing a process chamber, a plasma source unit connected to the housing, an electrostatic chuck connected to the housing, and a ring unit on an edge portion of the electrostatic chuck. The plasma source unit includes a shower head, wherein the shower head includes an upper electrode, and includes injection holes passing through part of the upper electrode and configured to inject gas into the chamber. The electrostatic chuck includes a lower electrode for mounting a semiconductor substrate thereon. The ring unit includes at least a focus ring and a cover ring surrounding the focus ring. The focus ring has an inner side surface and an outer side surface at a first height, and a width between the inner side surface and the outer side surface of the focus ring at the first height is a first width. The cover ring has an inner side surface and an outer side surface at the first height, and a width between the inner side surface and the outer side surface of the cover ring at the first height is a second width. The first width is between 2 and 10 time the second width. The method includes mounting a semiconductor substrate on the electrostatic chuck, applying a high frequency RF power to one of the electrostatic chuck and the shower head while injecting gas into the chamber from the shower head to generate a plasma inside the chamber, and etching the semiconductor substrate using the plasma to form a pattern on a surface of the semiconductor substrate.

According to some embodiments, a method of manufacturing a semiconductor device on a semiconductor substrate uses a plasma processing apparatus. The plasma processing apparatus includes a housing enclosing a process chamber, a plasma source unit connected to the housing, an electrostatic chuck connected to the housing, and a ring unit on an edge portion of the electrostatic chuck. The plasma source unit includes a shower head, wherein the shower head includes an upper electrode, and includes injection holes passing through part of the upper electrode and configured to inject gas into the chamber. The electrostatic chuck includes a lower electrode for mounting a semiconductor substrate thereon. The ring unit includes at least a focus ring and a cover ring surrounding the focus ring. The focus ring has a two-layer structure that includes a doped silicon layer as an upper layer having a first thickness and an insulating layer as a lower layer having a second thickness. The ratio of the first thickness to the second thickness is between 3:1 and 3:2. The method includes mounting a semiconductor substrate on the electrostatic chuck, applying a high frequency RF power to one of the electrostatic chuck and the shower head while injecting gas into the chamber from the shower head to generate a plasma inside the chamber, and etching the semiconductor substrate using the plasma to form a pattern on a surface of the semiconductor substrate.

DETAILED DESCRIPTION OF EXAMPLE EMBODIMENTS

Figure 1:
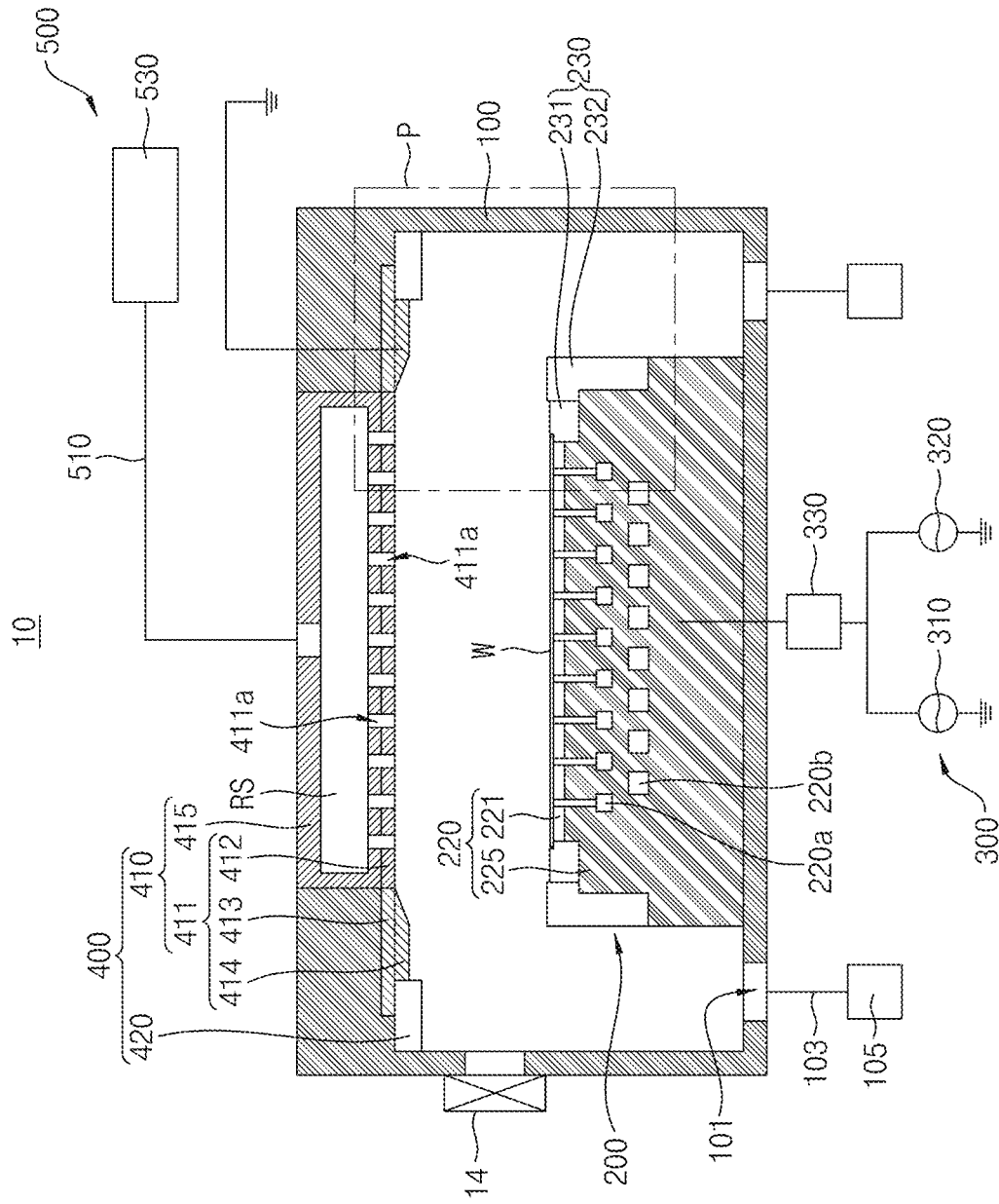
FIG. 1 is a schematic cross-sectional view of a substrate processing apparatus according to an exemplary embodiment of the inventive concept.
Figure 2:
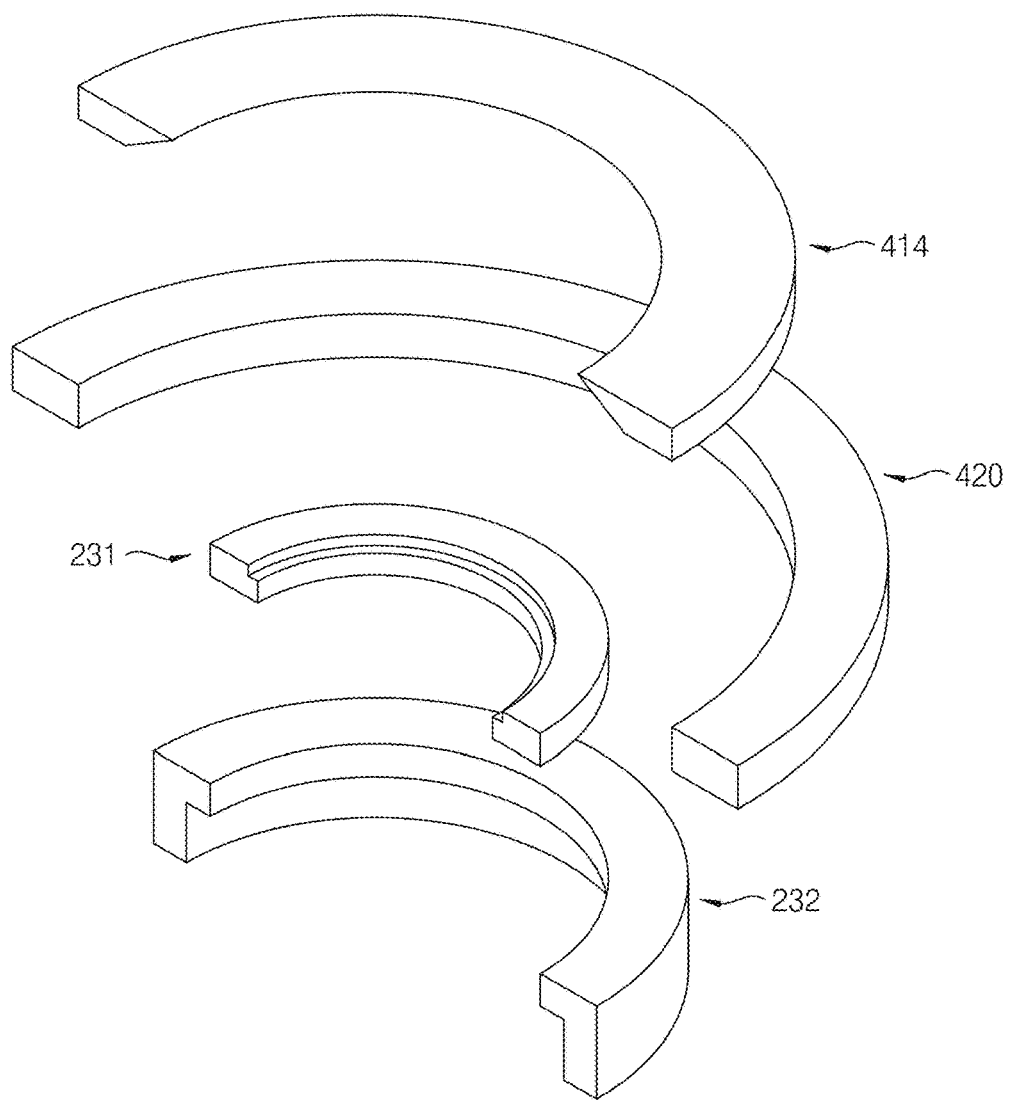
FIG. 2 is a perspective cross-sectional view illustrating a focus ring, a cover ring, a protruding electrode, and a fixing ring included in the substrate processing apparatus of FIG. 1, according to an exemplary embodiment of the inventive concept.

FIG. 1 is a schematic cross-sectional view of a substrate processing apparatus according to an exemplary embodiment of the inventive concept. FIG. 2 is a perspective cross-sectional view illustrating a focus ring, a cover ring, a protruding electrode, and a fixing ring included in the substrate processing apparatus of FIG. 1. In FIGS. 1 and 2, like reference numerals denote like elements. The substrate processing apparatus 10 according to exemplary embodiments of the inventive concept may process the substrate W using plasma. For example, the substrate processing apparatus 10 may be a capacitively coupled plasma (CCP) substrate processing apparatus capable of performing an etching process on the substrate W.

Referring to FIG. 1, a substrate processing apparatus 10 may include a process chamber 100, a support 200, and a plasma source unit 400. The substrate processing apparatus 10 may further include an exhaust unit 105, a power supply unit 300, and a gas supplying unit 500.

The process chamber 100 may have an interior space. For example, the process chamber 100 may have a cylindrical shape. The process chamber 100 may include aluminum. The process chamber 100 may have an electrical ground potential. The process chamber 100 may also be described as including housing enclosing a process chamber (e.g., the term "process chamber" may refer to the region enclosed or surrounded by the housing).

An exhaust port 101 is formed at the bottom of the process chamber 100, and the exhaust port 101 may be connected to an exhaust unit 105 installed under the process chamber 100 through an exhaust pipe 103. The exhaust pipe 103 may therefore be connected to an opening in the housing enclosing a process chamber. The exhaust unit 105 may include a vacuum pump such as a turbo pump to adjust a pressure of a processing space inside the process chamber 100 to a pressure of a desired degree of vacuum. For example, reaction by-products and residual gas generated during a substrate processing process are exhausted to the outside through the exhaust port 101 and the exhaust pipe 103, and the exhaust unit 105 may adjust the pressure in the process chamber 100.

The support 200 may be disposed at a lower portion inside the processing chamber 100. The support 200 may support a substrate W. The support 200 may adsorb the substrate W by using electrostatic force. In one exemplary embodiment, the support 200 can support the substrate W in the same manner as mechanical clamping. For example, the support 200 may be a susceptor for supporting the substrate W.

The support 200, also described as a support structure or a platform, may include an electrostatic chuck(ESC) 220 and a ring unit 230. The electrostatic chuck 220 may support the substrate W and the ring unit 230. The electrostatic chuck 220 may include a first circulation passage 220$a$ through which a heat transfer medium circulates and a second circulation passage 220$b$ through which a refrigerant circulates. The electrostatic chuck 220 may include a dielectric layer 221 and a lower electrode 225.

The dielectric layer 221 may be disposed on the lower electrode 225. The dielectric layer 221 may be a disc-shaped dielectric. The substrate W may be directly seated on a top surface of the dielectric layer 221. The top surface of the dielectric layer 221 may face a bottom surface of the plasma source unit 400. The dielectric layer 221 may have a diameter smaller than that of the substrate W. In one embodiment, in the top-down view, an edge area of the substrate W does not overlap the dielectric layer 221, and thus overhangs the dielectric layer 221. The dielectric layer may be formed of $Al_2O_3$, for example.

The dielectric layer 221 and the ring unit 230 may be disposed on the lower electrode 225. The lower electrode 225 may include and may be formed of a metal material. For example, the lower electrode 225 may include and may be formed of aluminum. The power supply unit 300 including a high frequency power supply 310, a low frequency power supply 320, and a matching unit 330 may be connected to the lower electrode 225. The lower electrode 225 may be provided with the high frequency power supply 310 and the low frequency power supply 320 through the matching unit 330. The high frequency power supply 310 may provide relatively high frequency power to the lower electrode 225, and the low frequency power supply 320 may provide relatively low frequency power to the lower electrode 225. For example, the high frequency power supply 310 may provide power of 40 to 60 MHz, and the low frequency power supply 320 may provide power of 400 kHz. The lower electrode 225 provided with the high frequency power may provide high frequency power to the processing space.

The ring unit 230 may be disposed on electrostatic chuck 220. The ring unit 230 has a ring shape in the top-down view and in some embodiments surrounds a top portion of the electrostatic chuck 220, and may be mounted on an edge portion of the electrostatic chuck 220. The ring unit 230 may have a ring-shaped body. For example, the ring unit 230 may surround the dielectric layer 221 and the substrate W on the dielectric layer 221 (e.g., to surround a circumference of the dielectric layer 221 and the substrate W on the dielectric layer 221). The ring unit 230 may be seated or placed on the lower electrode 225, so that a bottom of the ring unit 230 rests on a top surface at an outer portion of the lower electrode 225. The ring unit 230 may surround the upper portion of the lower electrode 225 (e.g., to surround a circumference of the upper portion of the lower electrode 225).

The plasma source unit 400 may be located above the process chamber 100. The plasma source unit 400 may be positioned on the support 200 to be spaced apart from the support 200 (e.g., to be located above the support 200). The processing space (plasma generating region) may be provided between the plasma source unit 400 and the electrostatic chuck 220. The plasma source unit 400 may generate a plasma from a processing gas supplied into the process chamber 100.

Referring to FIGS. 1 and 2, the ring unit 230 may include a ring-shaped focus ring 231 and a cover ring 232. The focus ring 231 may have a diameter smaller than that of the cover ring 232. The focus ring 231 may be disposed on the electrostatic chuck 220 to surround an outer portion (e.g., outer circumference) of the dielectric layer 221. The cover ring 232 may be disposed outside the focus ring 231 on the electrostatic chuck 220. The cover ring 232 may be disposed to surround an outer portion (e.g., circumference) of the focus ring 231. The focus ring 231 may control the electromagnetic field so that the density of the plasma is uniformly distributed in the entire area of the substrate W. Accordingly, each region of the substrate W may be uniformly etched. The cover ring 232 may serve to support the focus ring 231. An inner surface of the cover ring 232 may contact an outer surface of the focus ring 231.

The plasma source unit 400 may be connected to the housing, or may be considered part of the housing, and may include a shower head 410 and a fixing ring 420 positioned to support the shower head 410. The shower head 410 is positioned at a top portion of the process chamber 100 and may be disposed to face the electrostatic chuck 220 of the support 200. For example, the shower head 410 may include and be formed of silicon (Si).

The shower head 410 may include an upper electrode 411 and an electrode support 415. The upper electrode 411 may be detachably coupled to the electrode support 415. The electrostatic chuck 220 may be positioned below the upper electrode 411. The upper electrode 411 may be positioned above the support 200 to face the lower electrode 225. The upper electrode 411 may be a circular electrode plate. Injection holes 411a may be formed to penetrate the upper electrode 411 in the thickness direction. For example, the upper electrode 411 may include and be formed of silicon (Si). The shower head 410 may be connected to and may contact the housing of the process chamber 100, and therefore, may have an electrical ground potential. In some embodiments, however, the RF power may be supplied to the housing and/or shower head, and the electrostatic chuck may be connected to ground.

An electrode support 415 may be located on the upper electrode 411. The electrode support 415 may have a disc-shaped empty receiving space RS. A plurality of through holes may be formed at a bottom of the electrode support 415. Each through hole may overlap with the injection holes 411a of the upper electrode 411 in the top-down view. Thus, the receiving space RS and the processing space may communicate with the through holes and the injection holes 411a. The electrode support 415 may include a water cooling structure to cool the shower head 410 to a desired temperature during a plasma etching process. A gas supply hole may be formed on the electrode support 415. In one embodiment, the electrode support 415 may be made of a conductive material.

The upper electrode 411 of the substrate processing apparatus 10 may include an inner electrode 412, an outer electrode 413, and a protruding electrode 414. The inner electrode 412 may have a disc shape. The injection holes 411a may be formed to penetrate the inner electrode 412 in the thickness direction to communicate with the through holes of the electrode support 415. The inner electrode 412 serves to generate a plasma together with the lower electrode 225.

The outer electrode 413 has a ring shape and may be disposed to surround the inner electrode 412 (e.g., a circumference of the inner electrode 412). The outer electrode 413 may electrically connect the inner electrode 412 and the protruding electrode 414. The outer electrode 413 may be placed on the fixing ring 420 to stably fix the upper electrode 411. In one exemplary embodiment (not shown in FIG. 1), the outer electrode 413 is located inward of the fixing ring 420 in the top-down view and may not contact the fixing ring 420.

The protruding electrode 414 has a ring shape and may be positioned below the outer electrode 413. The protruding electrode 414 may be located inside the fixing ring 420. The protruding electrode 414 may serve to physically confine the generated plasma in the processing space.

The fixing ring 420 may be located at an upper corner of the process chamber 100. The fixing ring 420 may be located near an outside of the shower head 410. The fixed ring 420 may be ring shaped (e.g., circular, or oval shaped). The fixing ring 420 may have a larger diameter than that of the protruding electrode 414. In one exemplary embodiment, the fixing ring 420 may fix the shower head 410 to the top portion of the process chamber 100. For example, the fixing ring 420 may support the outer electrode 413 under the outer electrode 413 of the upper electrode 411. For example, fixing ring 420 may comprise and may be formed of quartz.

The gas supplying unit 500 is connected to the shower head 410. The gas supplying unit 500 includes a gas supply pipe 510, a flow controller, and a gas supply source 530. The gas supply pipe 510 is connected to the receiving space RS through the gas supply hole of the electrode support 415, and the flow controller may control a supply flow rate of the processing gas that flows into the process chamber 100 through the gas supply pipe 510. For example, the gas source 530 may include a plurality of gas tanks, and the flow controller may include a plurality of mass flow controllers respectively corresponding to the gas tanks. The mass flow controllers can independently control the supply flow rates of the processing gases. The mass flow controllers may be, for example, computer-based control systems that include hardware and software configured to control the flow of the gas in the gas tanks.

Figure 3:
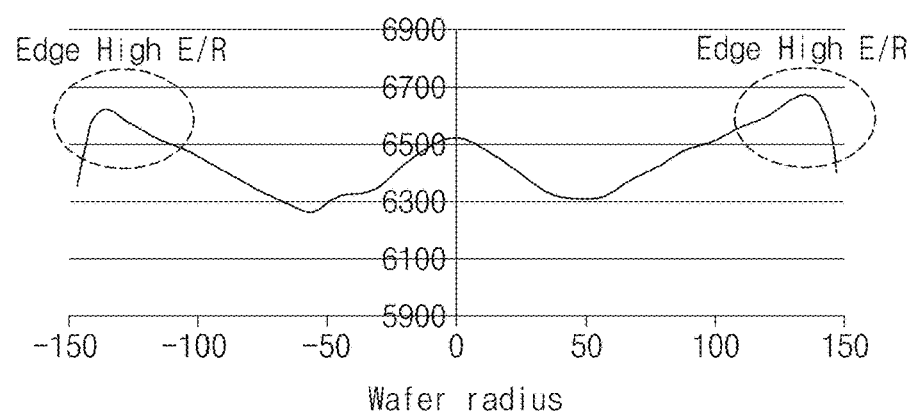
FIG. 3 is a graph showing an etching rate according to an area of a substrate in a conventional substrate processing apparatus.

FIG. 3 is a graph showing an etching rate according to an area of a substrate in a conventional substrate processing apparatus.

Referring to FIG. 3, in the conventional substrate processing apparatus, it can be seen that the etching rate is high in the edge region of the substrate (for example, around 150 mm of the substrate radius). When high frequency power is applied to a support of the conventional substrate processing apparatus, an electrostatic chuck and a focus ring including different materials may have impedance differences with respect to high frequency power. According to the impedance difference between the electrostatic chuck and the focus ring, RF phase difference occurs between a processing space on the electrostatic chuck and a processing space on the focus ring. A plasma density difference occurs between plasma on the electrostatic chuck and plasma on the focus ring by the phase difference. Due to the plasma density difference, a high density plasma region may be formed where plasma is concentrated on the edge region of the substrate. As a result, the etching rate is not uniform on the substrate, as shown in FIG. 3, the etching rate may be different for each position of the substrate.

In order to address this issue, a substrate processing apparatus for generating plasma having a wider radius than the radius of a substrate may be used, so that a high density plasma region is formed outside the edge region of the substrate and the plasma density is uniform on the substrate. For example, various embodiments can provide the substrate processing apparatus capable of generating plasma having a radius range that is approximately wider by a skin depth than the radius in which the plasma is generated in a conventional substrate processing apparatus. (for example, the skin depth may be determined by the frequency of the high frequency power in the substrate processing apparatus.) As such, in some embodiments, the fixing ring 420, focus ring 231, and cover ring 232 are arranged to cause a peak plasma concentration during a plasma processing operation within the process chamber 100 to occur outside of an area, from a top-down view, covered by a semiconductor wafer when mounted.

To this end, certain disclosed embodiments provide 1) diffusing physically the plasma in the substrate processing apparatus as shown in FIG. 1, and/or 2) reducing the impedance difference between the electrostatic chuck 220 and the focus ring 231 for the high frequency power, thereby minimizing the RF phase difference.

In detail, a shape, a material, a thickness and/or a resistivity of the focus ring 231 (the resistivity can vary depending on the shape, the material and/or the thickness of the focus ring) and a thickness of the dielectric layer 221 are capable of minimizing the impedance difference with respect to the high frequency power of the electrostatic chuck 220 and the focus ring 231. For example, the focus ring 231 and the dielectric layer 221 capable of minimizing the impedance difference may prevent the maximum value of the electric potential according to the RF phase difference between the electrostatic chuck 220 and the focus ring 231 from exceeding the value for ionization threshold.

Hereinafter, as described above, the exemplary embodiments of the substrate processing apparatus of the inventive concept that can generate plasma having a radius larger than that of the substrate W will be described in detail.

Figure 4:
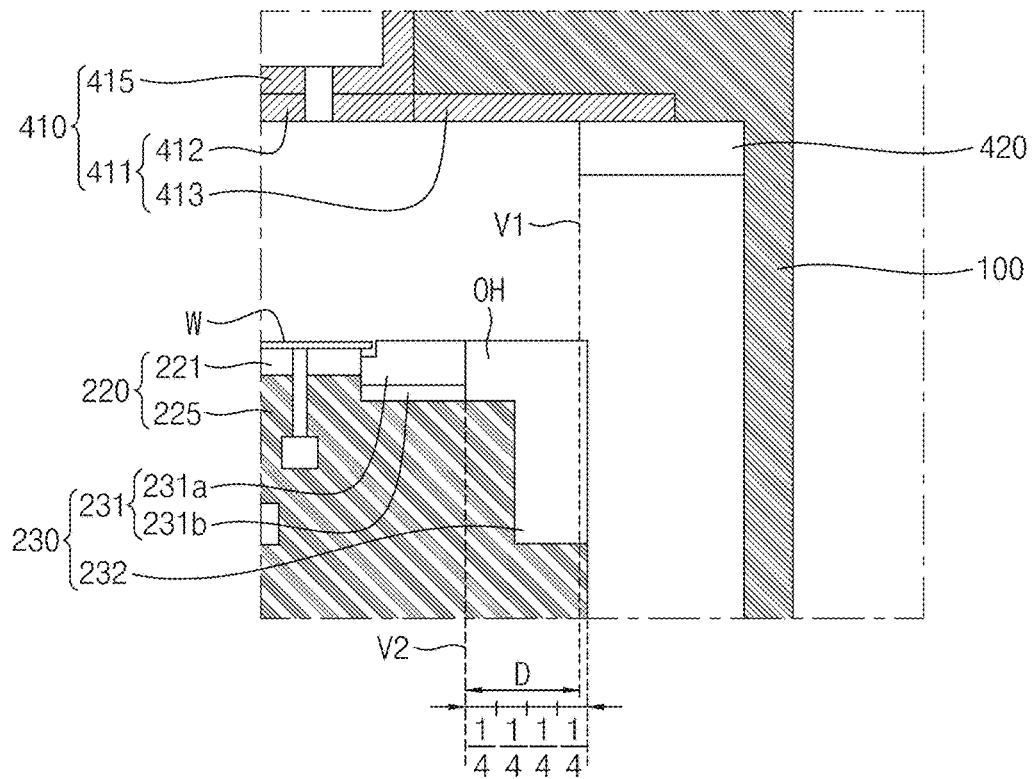
FIG. 4 is an enlarged cross-sectional view of a P region according to an exemplary embodiment.

FIG. 4 is an enlarged cross-sectional view of a region P according to an exemplary embodiment. The same reference numerals in FIGS. 1, 2, and 4 refer to the same components, and hereinafter, the same descriptions as those of FIGS. 1 and 2 will be omitted.

Referring to FIG. 4, the ring unit 230 may include a focus ring 231 and a cover ring 232. The focus ring 231 may be seated on a top surface of the electrostatic chuck 220. The focus ring 231 may be disposed on a lower electrode 225. The focus ring 231 may have a ring shape (e.g., a circular shape). The focus ring 231 may have a step on an upper portion thereof. For example, when a substrate W is seated on a support 200, the focus ring 231 may include a first top surface positioned at a level higher than a bottom surface of the substrate W and a second top surface positioned at a lower level than the bottom surface of the substrate W.

The cover ring 232 may be disposed outside the focus ring 231 on the electrostatic chuck 220 (e.g., to surround an outer circumference of the focus ring 231). The cover ring 232 may have a ring shape (e.g., a circular shape) having a radius larger than that of the focus ring 231. The cover ring 232 may include an overhang portion OH having a bottom surface coplanar with a bottom surface of the focus ring 231. The overhang portion OH may cover part of the top surface of the lower electrode 225. For example, the cover ring 232 may comprise quartz.

In one exemplary embodiment, the focus ring 231 may include an upper layer 231a and a lower layer 231b. The upper layer 231a may be located on the lower layer 231b. For example, the upper layer 231a may include silicon (Si), and the lower layer 231b may include an insulator such as alumina ($Al_2O_3$) that forms an insulating layer. In one exemplary embodiment, silicon (Si) of the upper layer 231a may be doped with impurities. Resistivity of the focus ring 231 may vary depending on the material of the upper layer 231a, the material of the lower layer 231b, a thickness of each of the upper layer 231a and lower layer 231b, the type of the impurity doped in the upper layer 231a, and/or the concentration of the impurity doped in the upper layer 231a. For example, the upper layer 231a of the focus ring 231 may be doped with impurities such that the focus ring 231 has the resistivity of approximately 100 Ω·cm.

A ratio of a thickness of the upper layer 231a (e.g., its maximum thickness other than where the step is formed) to a thickness of the lower layer 231b may be between 4:1 to 3:2 (i.e., the thickness of the lower layer 231b is 0.2 to 0.4 times the total thickness of the focus ring 231). For example, the thickness of the upper layer 231a may be between about 3 mm and about 4 mm, and the thickness of the lower layer 231b may be between about 1 mm and about 2 mm. The resistivity of the focus ring 231 may be approximately 100 Ω·cm. The dielectric layer 221 of the electrostatic chuck 220 may have a thickness of about 1 to 4 mm. In one example embodiment, the thickness of the dielectric layer 221 is about 3 mm. When the thickness of the dielectric layer 221 is 3 to 4 mm, the dielectric layer 221 may have excellent durability. In some embodiments, the thicknesses of the dielectric layer 221, the upper layer 231a, and the lower layer 231b are selected from among the values described above so that the thickness of the dielectric layer 221 is at least 50% greater than the thickness of the lower layer 231b.

When the etching process is performed in the substrate processing apparatus 10 including the focus ring 231 and the dielectric layer 221 as aforementioned, the impedance difference with respect to the high frequency power between the electrostatic chuck 220 and the focus ring 231 is reduced and the RF phase difference can be reduced. As a result, a plasma density difference on the electrostatic chuck 220 and the plasma density on the focus ring 231 are reduced, and a high density plasma region can be formed outside the edge region of the substrate W. Therefore, a uniform plasma region can be formed on the whole of the substrate W. In one embodiment of FIG. 4, a width of the focus ring 231 from an innermost side surface (e.g., an inner side surface at a first height contacting the dielectric layer 221) to an outermost side surface (e.g., an outer side surface at the first height contacting the cover ring 232) may be about the same as a width of the cover ring 232 from an innermost side surface (e.g., an inner side surface at the first height contacting the focus ring 231) to an outermost side surface (e.g., an opposite, outer side surface at the first height).

In one exemplary embodiment, the upper electrode 411 of the shower head 410 may include an inner electrode 412 and an outer electrode 413. In one embodiment, a bottom surface of the outer electrode 413 is exposed, and the upper electrode 411 does not include the protruding electrode 414. A portion of the bottom surface of the outer electrode 413 may contact a top surface of a fixing ring 420.

The fixing ring 420 may extend wide inwardly to cover the cover ring 232. For example, at least part of the fixing ring 420 may overlap a top surface of the cover ring 232 in the top-down view. For example, the cover ring 232 may have a size and positioning to have an outermost circumferential side surface that vertically overlaps the fixing ring 420 from the top-down view. The fixing ring 420 may have an inner diameter larger than an inner diameter of the cover ring 232 and smaller than an outer diameter of the cover ring 232. In one exemplary embodiment, a horizontal distance D between the first vertical line V1 aligned with an inner surface (e.g., an inner diameter) of the fixing ring 420 and the second vertical line V2 aligned with an inner surface (e.g., an inner diameter) of the cover ring 232 may be ¾ or more of the width of the top surface of the cover ring 232 and may be smaller than the width of the top surface of the cover ring 232. When the protruding electrode 414 which prevents the diffusion of the plasma and confines the plasma into the processing space is removed, the high density plasma region formed at and/or near the edge region of the substrate W may be formed farther outward than the edge region of the substrate W. In addition, by limiting the length that the fixing ring 420 extends inward, plasma diffusion may be prevented by the fixing ring 420 so that the high density plasma region may not be formed in the edge region of the substrate W. In addition, the fixing ring 420 may stably support the upper electrode 411.

Figure 5A:
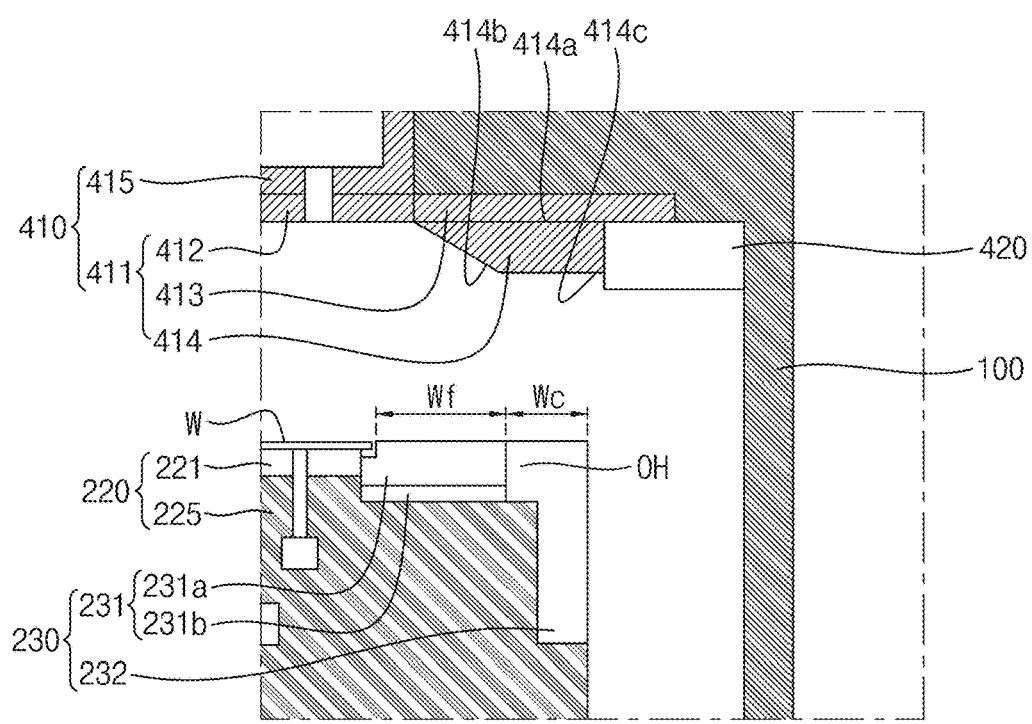
FIG. 5A is an enlarged cross-sectional view of a region P according to an exemplary embodiment.
Figure 5B:
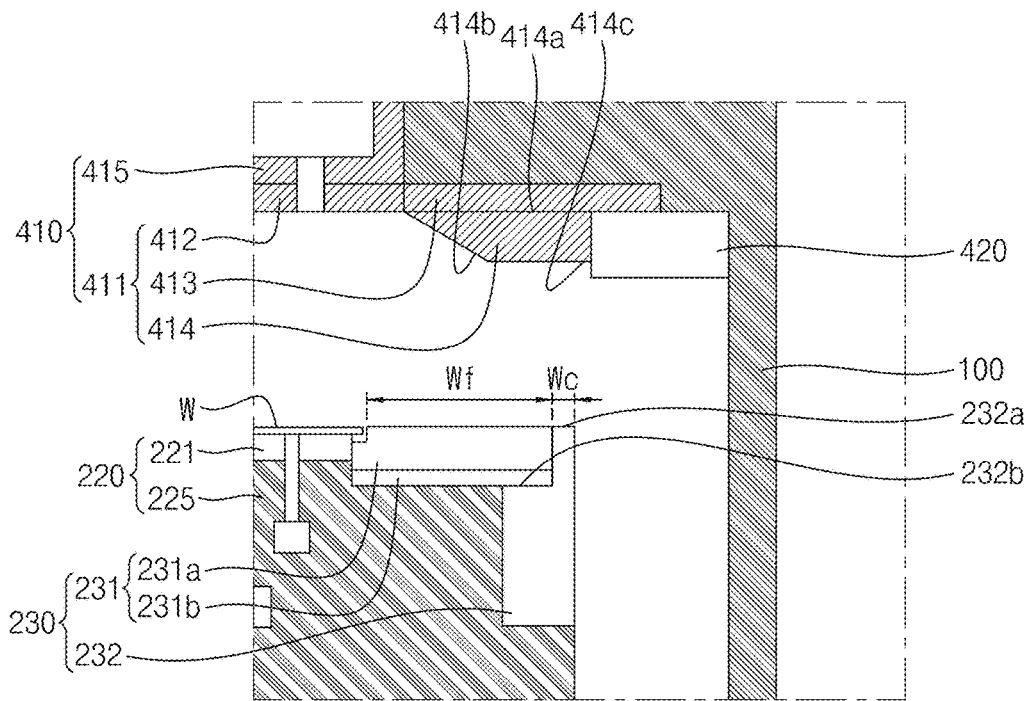
FIG. 5B is an enlarged cross-sectional view of a region P according to an exemplary embodiment.

FIG. 5A is an enlarged cross-sectional view of a region P according to an exemplary embodiment. FIG. 5B is an enlarged cross-sectional view of a region P according to the exemplary embodiment such as shown in FIG. 1. The same reference numerals in FIGS. 1, 2, 4, 5A, and 5B refer to the same components, and hereinafter, the same descriptions as those of FIGS. 1, 2, and 4 will be omitted.

Referring to FIG. 5A, the upper electrode 411 of the shower head 410 may include an inner electrode 412, an outer electrode 413, and a protruding electrode 414. The protruding electrode 414 may be coupled to the lower portion of the outer electrode 413. The protruding electrode 414 may be detachably coupled to the outer electrode 413. In one exemplary embodiment, the protruding electrode 414 may be integral with the outer electrode 413. The protruding electrode 414 may have a ring shape. An inner diameter of the protruding electrode 414 may be substantially the same as or larger than an outer diameter of the inner electrode 412.

The protruding electrode 414 may include a first lower surface 414b and a second lower surface 414c. The first lower surface 414b may be inclined with respect to an upper surface 414a of the protruding electrode 414 in contact with a bottom surface of the outer electrode 413, and the second lower surface 414c may be parallel to the upper surface 414a. The first lower surface 414b may be positioned adjacent to the inner electrode 412, and the second lower surface 414c may be located outside the first lower surface 414b. For example, the first bottom surface 414b may have an inclination of 45° or less with respect to the upper surface 414a. Preferably, the first lower surface 414b has an inclination of 20° to 25° with respect to the upper surface 414a. The protruding electrode 414 may include the same material as the inner electrode 412. For example, the protruding electrode 414 may include silicon (Si).

The ring unit 230 may include a focus ring 231 having an expanded width and a cover ring 232 having a reduced width. In one exemplary embodiment, a horizontal width Wf of a top surface of the focus ring 231, or an overall width of the focus ring 231—e.g., from an innermost side surface (e.g., an inner side surface at a first height contacting the dielectric layer 221) to an outermost side surface (e.g., an outer side surface at a second height contacting the cover ring 232) may be 2 to 10 times a horizontal width Wc of a first top surface 232a of the cover ring 232, or a width of the cover ring 232—e.g., from an inner side surface (e.g., an inner side surface at the first height contacting the focus ring 231) to an outermost side surface (e.g., an opposite, outer side surface at the first height). For example, where a combined width of the focus ring 231 and cover ring 232 is 50 mm (e.g., for a 300 mm diameter wafer, in one embodiment), the widths may vary from a width of the focus ring 231 being 33.5 mm and a width of the cover ring 232 being 16.5 mm, to a width of the focus ring 231 being 45.5 mm and a width of the cover ring 232 being 4.5 mm. In this manner, the width of the focus ring 231 may be between about 10% and 15%, or in some examples, between about 11.1% and 15.2% of the diameter of the semiconductor substrate (e.g., wafer) W. As a width of the focus ring 231 that densifies the plasma into a processing region becomes wider, diffusion of the plasma is increased, whereby a high density plasma region may be formed outside the edge region of the substrate W.

As shown in FIG. 5A, the focus ring 231 may include an upper layer 231a including, for example, silicon (Si) and a lower layer 231b including, for example, alumina($Al_2O_3$). A ratio of the thicknesses of the upper layer 231a (e.g., its maximum thickness other than where the step is formed) to the lower layer 231b may be between 4:1 and 3:2 (i.e., the thickness of the lower layer 231b is 0.2 to 0.4 times the thickness of the focus ring 231). Resistivity of the focus ring 231 may be approximately 100 Ω·cm. The dielectric layer 221 of the electrostatic chuck 220 may have a thickness of about 3 to 4 mm.

Referring to FIG. 5B, in one exemplary embodiment, in case a horizontal width Wf of a top surface of a focus ring 231, or an overall width of the focus ring 231—e.g., from an innermost side surface (e.g., a side surface contacting the dielectric layer 221) to an outermost side surface (e.g., a side surface contacting the cover ring 232) is 2 to 10 times a horizontal width Wc of a first top surface 232a of a cover ring 232, a portion (inner portion) of the focus ring 231 may be disposed on a lower electrode 225, and the other portion (outer portion) may be disposed on the cover ring 232. The cover ring 232 includes a first top surface 232a and a second top surface 232b to have a step and the first top surface 232a may be positioned at a level higher than the second top surface 232b. The first top surface 232a may be located inward of the second top surface 232b. An outer portion of the focus ring 231 may lie on the second top surface 232b.

Figure 6A:
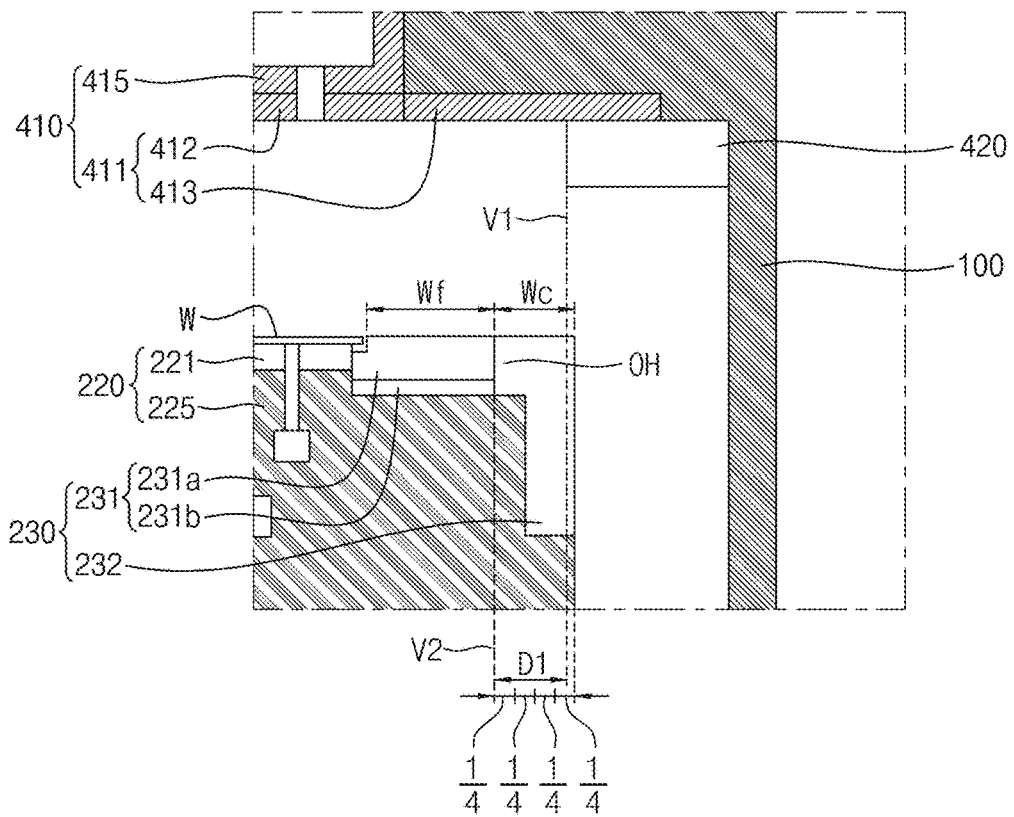
FIG. 6A is an enlarged cross-sectional view of a region P according to an exemplary embodiment.

FIG. 6A is an enlarged cross-sectional view of a region P according to an exemplary embodiment. The same reference numerals in FIGS. 1, 2 and 4 to 6b refer to the same components, and hereinafter, the same descriptions as those of FIGS. 1, 2 and 4 to 5b will be omitted.

Referring to FIG. 6A, a dielectric layer 221 of an electrostatic chuck 220, a focus ring 231 and a cover ring 232 of a ring unit 230 may have the same configuration as that of FIG. 5A. For example, a horizontal width Wf of a top surface of the focus ring 231 may be 2 to 10 times a horizontal width Wc of a top surface of the cover ring 232.

An upper electrode 411 of a shower head 410 may include an inner electrode 412 and an outer electrode 413. In contrast to FIG. 5A, the upper electrode 411 does not include the protruding electrode 414, and at least a portion of a lower surface of the outer electrode 413 may be exposed.

A fixing ring 420 positioned below the outer electrode 413 has a relatively wider width than the fixing ring 420 of FIG. 5A and may extend inwardly to cover (e.g., vertically overlap) the cover ring 232. In one exemplary embodiment, the fixing ring 420 may have an inner diameter larger than an inner diameter of the cover ring 232 and smaller than an outer diameter of the cover ring 232. In one exemplary embodiment, a horizontal distance D between a first vertical line V1 aligned with an inner surface of the fixing ring 420 and a second vertical line V2 aligned with an inner surface of the cover ring 232 may be ¾ or more of a horizontal width Wc of a top surface of the cover ring 232 and may be smaller than the horizontal width Wc of the top surface of the cover ring 232.

Figure 6B:
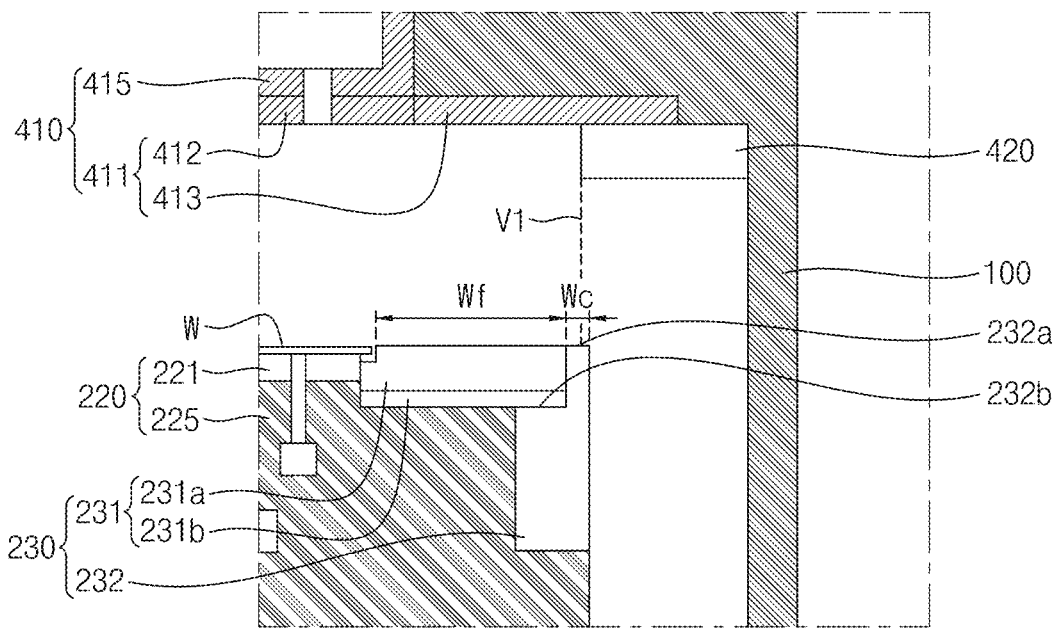
FIG. 6B is an enlarged cross-sectional view of a region P according to an exemplary embodiment.

Referring to FIG. 6B, a dielectric layer 221 of an electrostatic chuck 220, a focus ring 231 of a ring unit 230, a cover ring 232, and an upper electrode 411 of a shower head 410 may have the same configuration as the configurations of FIG. 5B. For example, a horizontal width Wf of a top surface of the focus ring 231 is 2 to 10 times a horizontal width Wc of a first top surface 232a of the cover ring 232, and an outer portion of the focus ring 231 may be located on a second top surface 232b of the cover ring 232.

The upper electrode 411 of the shower head 410 may include an inner electrode 412 and an outer electrode 413. The upper electrode 411 does not include the protruding electrode 414, and a portion of a bottom surface of the outer electrode 413 may be exposed. A fixing ring 420 may be disposed to overlap with the cover ring 232 in the top-down view. For example, a first vertical line V1 aligned with an inner surface of the fixing ring 420 may pass through the first top surface 232a or the second top surface 232b of the cover ring 232.

When the etching process is performed in the substrate processing apparatus 10 having the configuration of FIGS. 5A, 5B, 6A, and 6B, in contrast to conventional substrate processing apparatus, according to the thickness of the dielectric layer 221 and resistivity of the focus ring 231, the impedance difference with respect to high frequency power may be reduced, thereby reducing the RF phase difference. And plasma concentration by the expanded focus ring 231 can be reduced.

As shown in FIGS. 6A and 6B, when the protruding electrode 414 which prevents the diffusion of the plasma and confines the plasma into a processing space is removed, the plasma may be more easily spread. Thus, a high density plasma region formed in the edge region of the substrate W may be formed outside the edge region of the substrate W. In addition, the fixing ring 420 may stably support the upper electrode 411 of the shower head 410, and may cause the high density plasma region to be formed outside the edge region.

Figure 7A:
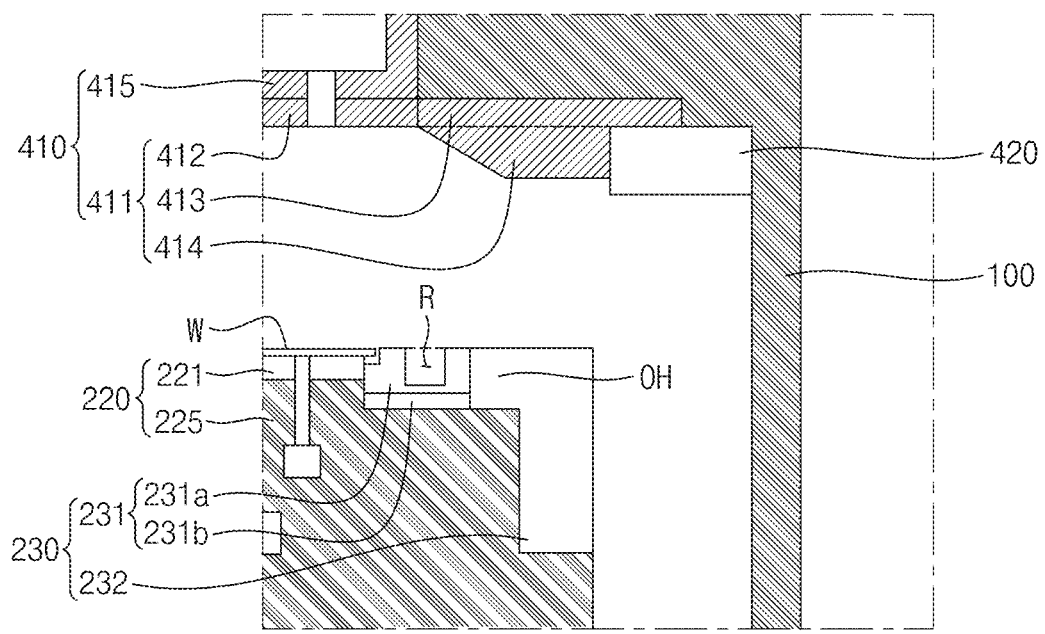
FIG. 7A is an enlarged cross-sectional view of a region P according to an exemplary embodiment.
Figure 7B:
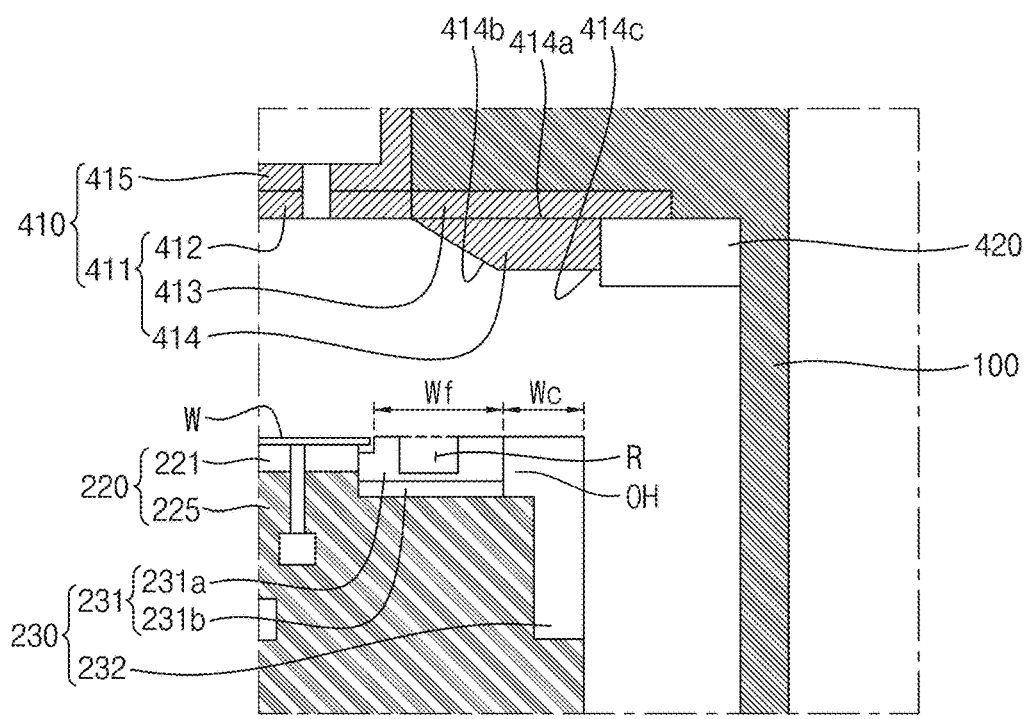
FIG. 7B is an enlarged cross-sectional view of a region P according to an exemplary embodiment.

FIG. 7A is an enlarged cross-sectional view of a region P according to an exemplary embodiment. FIG. 7B is an enlarged cross-sectional view of a region P according to an exemplary embodiment. The same reference numerals in FIGS. 1, 2 and 4 to 7b refer to the same components, and hereinafter, the same descriptions as those of FIGS. 1 to 6b will be omitted.

Referring to FIG. 7A, a dielectric layer 221 may have a thickness of 3 to 4 mm. A focus ring 231 may include an upper layer 231a including silicon (Si) and a lower layer 231b including alumina ($Al_2O_3$). In one exemplary embodiment, silicon (Si) of the upper layer 231a may be doped with impurities. The ratio of the thicknesses of the upper layer 231a to the lower layer 231b may be 4:1 to 3:2 (i.e., the thickness of the lower layer 231b is 0.2 to 0.4 times the thickness of the focus ring 231). The upper electrode 411 of the shower head 410 may include an inner electrode 412, an outer electrode 413, and a protruding electrode 414.

In one exemplary embodiment, a recess R having a predetermined width and a predetermined depth may be formed in the upper layer 231a of the focus ring 231 along a circumferential direction of the focus ring 231. A volume of the recess R may be 0.25 to 4 times a volume of the focus ring 231 (e.g., 0.25 to 4 times a volume of the material that forms the focus ring 231). That is, the volume of the recess R may be 20% to 80% of the volume of the focus ring 231 (for example, the volume of the focus ring 231 of FIG. 4 if the focus ring 231 did not have the recess R). In FIG. 7A, a cross section of the recess R is illustrated as a rectangle, but the inventive concept is not limited thereto, and the recess R may have various shapes formed by recessing the upper layer 231a of the focus ring 231 concavely downward. The recess R may be formed in an upper surface of the focus ring 231, outside of an area where the semiconductor substrate W is mounted. When the recess R is formed in the focus ring 231, an impedance of the focus ring 231 with respect to the frequency of the high frequency power is reduced in the plasma etching process, and the high density plasma region may be formed outward than the edge region of the substrate W.

Referring to FIG. 7B, a recess R may also be formed in a focus ring 231 having an extended width. A substrate processing apparatus of FIG. 7B includes a configuration corresponding to that of FIG. 7A, a horizontal width Wf of a top surface of a focus ring 231 in which the recess R is formed, or a width of the focus ring 231—e.g., from an outermost side surface (e.g., an outer side surface at a first height contacting the cover ring 232) to an innermost side surface (e.g., an opposite, inner side surface at the first height) may be 2 to 10 times a horizontal width Wc of a top surface of the cover ring 232. A volume of the recess R may be 0.25 to 4 times a volume of the focus ring 231. That is, the volume of the recess R may be 20% to 80% of the volume of the focus ring 231 and recess R combined (for example, the volume of the focus ring 231 of FIG. 5A if the focus ring 231 did not have the recess R). As shown in FIG. 7B, a high density plasma region may be formed farther outward from the edge region of the substrate W in the substrate processing apparatus having the recess R and the extended width than in the substrate processing apparatus of FIG. 7A.

Figure 8A:
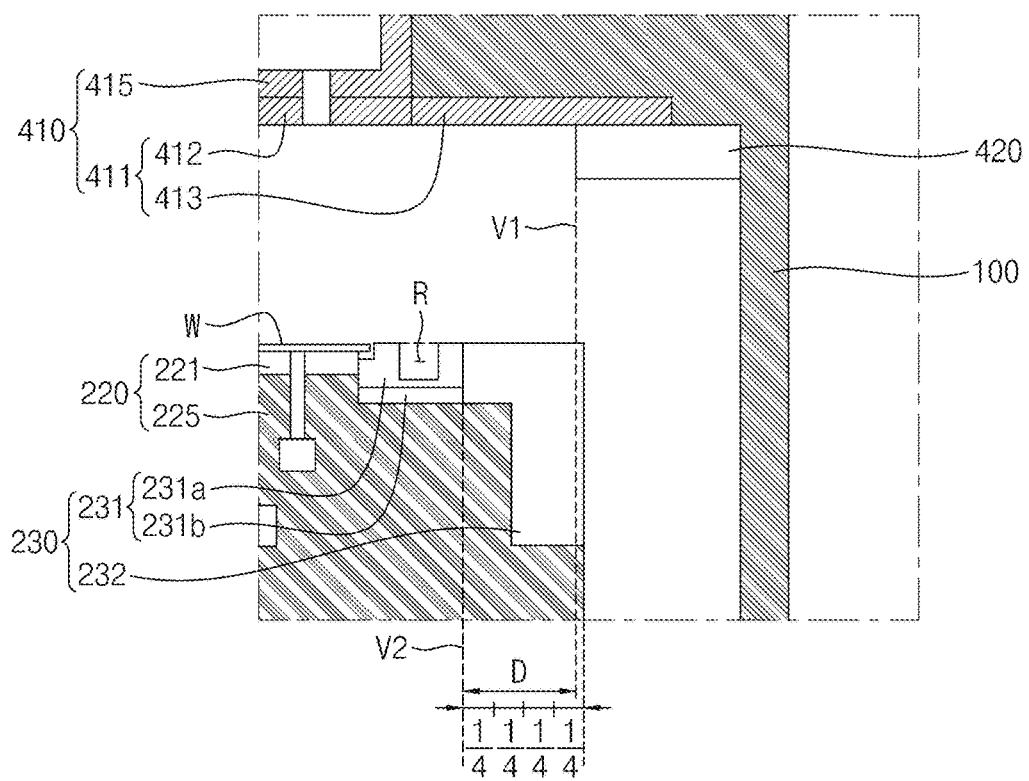
FIG. 8A is an enlarged cross-sectional view of a region P according to an exemplary embodiment.
Figure 8B:
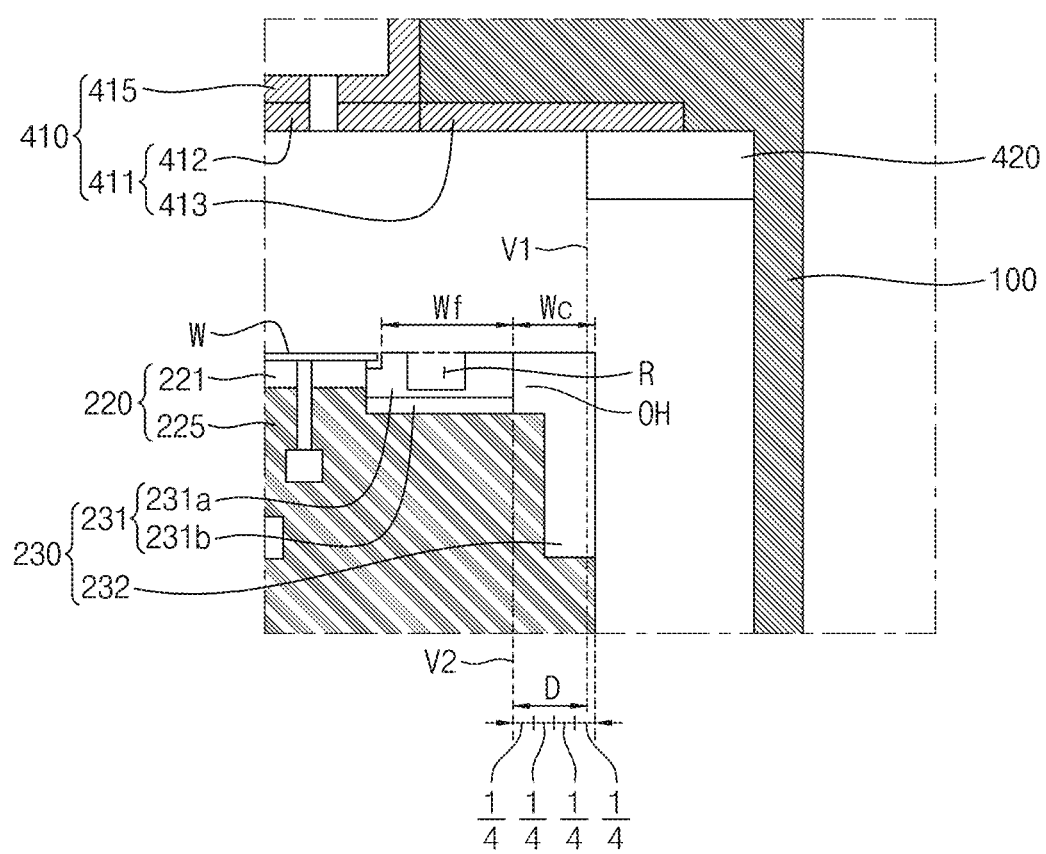
FIG. 8B is an enlarged cross-sectional view of a region P according to an exemplary embodiment.

FIG. 8A is an enlarged cross-sectional view of a region P according to an exemplary embodiment. FIG. 8B is an enlarged cross-sectional view of a region P according to an exemplary embodiment. In FIG. 1, FIG. 2, and FIG. 4 to FIG. 8B, the same reference numerals refer to same components, and hereinafter, the same descriptions as those of FIGS. 1 to 7B will be omitted.

Referring to FIG. 8A, a dielectric layer 221 of an electrostatic chuck 220, a focus ring 231 and a cover ring 232 of a ring unit 230, an inner electrode 412 and an outer electrode 413 of an upper electrode 411 may be the same as the configurations of FIG. 7A.

In FIG. 8A, in contrast to FIG. 7A, the upper electrode 411 does not include the protruding electrode 414, and the fixing ring 420 may have a relatively extended width. The fixing ring 420 and the cover ring 232 may overlap as described in FIG. 4. Since the upper electrode 411 does not include the protruding electrode 414, diffusion of the plasma is increased so that a high density plasma region may be formed outwards farther than the edge region of the substrate W. As a result, the edge region and the other regions of the substrate W may have a uniform etching rate.

Referring to FIG. 8B, a dielectric layer 221 of an electrostatic chuck 220, a focus ring 231 and a cover ring 232 of a ring unit 230 included in a substrate processing apparatus may be the same as those of FIG. 7B. For example, a recess R is formed in the focus ring 231, and a horizontal width Wf of a top surface of the focus ring 231, or a width of the focus ring 231—e.g., from an outermost side surface (e.g., an outer side surface at a first height contacting the cover ring 232) to an innermost side surface (e.g., an opposite, inner side surface at the first height) may be 2 to 10 times a horizontal width We of a top surface of the cover ring 232. A volume of the recess R may be 0.25 to 4 times a volume of the focus ring 231. In FIG. 8B, in contrast to FIG. 7B, an upper electrode 411 does not include the protruding electrode 414, and a horizontal distance D between a first vertical line V1 aligned with an inner surface of the fixing ring 420 and a second vertical line V2 aligned with an inner surface of the cover ring 232 may be ¾ or more of a width of a top surface of the cover ring 232 and may be smaller than the width of the top surface of the cover ring 232. As a result, diffusion of the plasma may be increased, so that a high density plasma region may be formed farther outside than an edge region of the substrate W. As a result, the edge region and the other regions of the substrate W may have a uniform etching rate. As can be seen from the embodiments of FIGS. 4, 6A, 6B, 8A, and 8B, the upper electrode 411 overlaps the focus ring 231 and cover ring 232 and overlaps a first region where the substrate W gets mounted, from a top-down view, and a bottom surface of the upper electrode 411 where the upper electrode 411 overlaps the focus ring 231 and cover ring 232 is coplanar with a bottom surface of the upper electrode 411 where the upper electrode 411 overlaps the first region.

Figure 9:
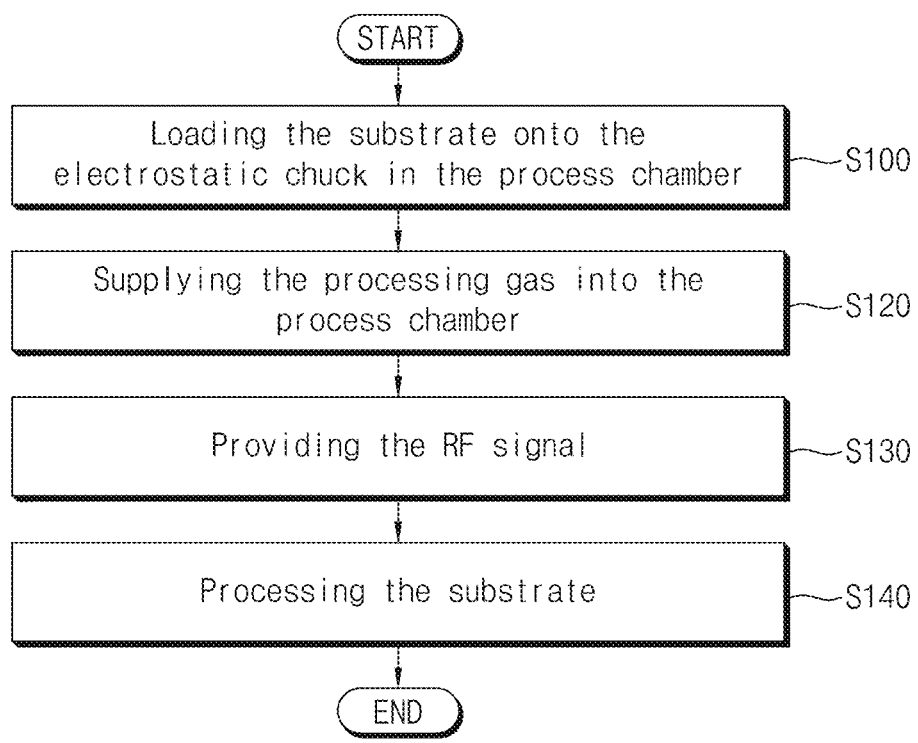
FIG. 9 is a flowchart illustrating a method of processing a substrate by operating a substrate processing apparatus according to an exemplary embodiment of the inventive concept.

FIG. 9 is a flowchart illustrating a method of processing a substrate by operating a substrate processing apparatus according to an exemplary embodiment of the inventive concept.

Referring to FIGS. 1 and 9, a substrate processing method according to one exemplary embodiment of the inventive concept may include loading the substrate W onto the electrostatic chuck 220 in the process chamber 100 (S100), supplying a processing gas into the process chamber 100 (S120), providing an RF signal to the lower electrode 225 (S130), and processing the substrate W (S140).

Loading the substrate W onto the electrostatic chuck 220 in the process chamber 100 (S100) may include introducing the substrate W to be processed into the process chamber 100 from the outside through the gate 14, mounting the substrate W on the electrostatic chuck 220 of the support 200, and adsorbing the substrate W on the dielectric layer 221 of the electrostatic chuck 220.

Supplying the processing gas into the process chamber 100 (S120) includes supplying the processing gas from the gas supply part 500 to the receiving space RS of the shower head 410, and the process gas is distributed through the injection holes 411a of the shower head 410 into the shower shape in the process chamber 100 to be supplied to the process space in the process chamber 100.

Providing the RF signal to the lower electrode 225 (S130) includes supplying a RF power to the lower electrode 225 from the power supply unit 300 to excite the process gas into a plasma state, and selectively etching the substrate W and/or an etching target layer on the substrate W. The RF signal may include a high frequency power provided from the high frequency power supply 310 and a low frequency power provided from the low frequency power supply 320. In one exemplary embodiment, the high frequency power supply 310 of the power supply unit 300 may generate a capacitively coupled plasma inside the process chamber 100. The low frequency power source 320 may induce the generated capacitively coupled plasma to the substrate W. For example, the high frequency power supply 310 of the power supply unit 300 may provide the high frequency power of 40 to 60 MHz to the electrostatic chuck 220. At the same time that the high frequency power supply 310 applies the high frequency power, the low frequency power source 320 may apply the low frequency power of 400 kHz to the electrostatic chuck 220. It should be noted that in some embodiments, the RF signal may be applied to the upper electrode (e.g., shower head 410) and the electrostatic chuck 220 is connected to ground.

Although the steps of providing the RF signal S130 and supplying the gas (S120) are depicted in a particular order in FIG. 9, they may initially occur in the opposite order. In either case, the method includes applying a high frequency RF power to one of the electrostatic chuck 220 and the shower head 410 while injecting gas into the chamber 100 from the shower head 410 to generate a plasma inside the chamber 100.

Processing the substrate W (S140) may include etching an etch target layer on the substrate W using the plasma, to form a pattern on a surface of the substrate W. The plasma in which the processing gas is excited by the high frequency power may be accelerated to a surface of the substrate W by the low frequency power, and may react with the substrate W.

The etching process of the substrate W is completed, and residual gas in the processing space may be discharged to the outside of the process chamber 100 through the exhaust hole. Residual gas may include reaction byproducts. The substrate W may be separated from the electrostatic chuck 220 and the substrate W may be retrieved in the process chamber 100. Additional processes, for example, using different processing chambers, may be later carried out to form a semiconductor device, such as a semiconductor chip, from the substrate W.

Figure 10:
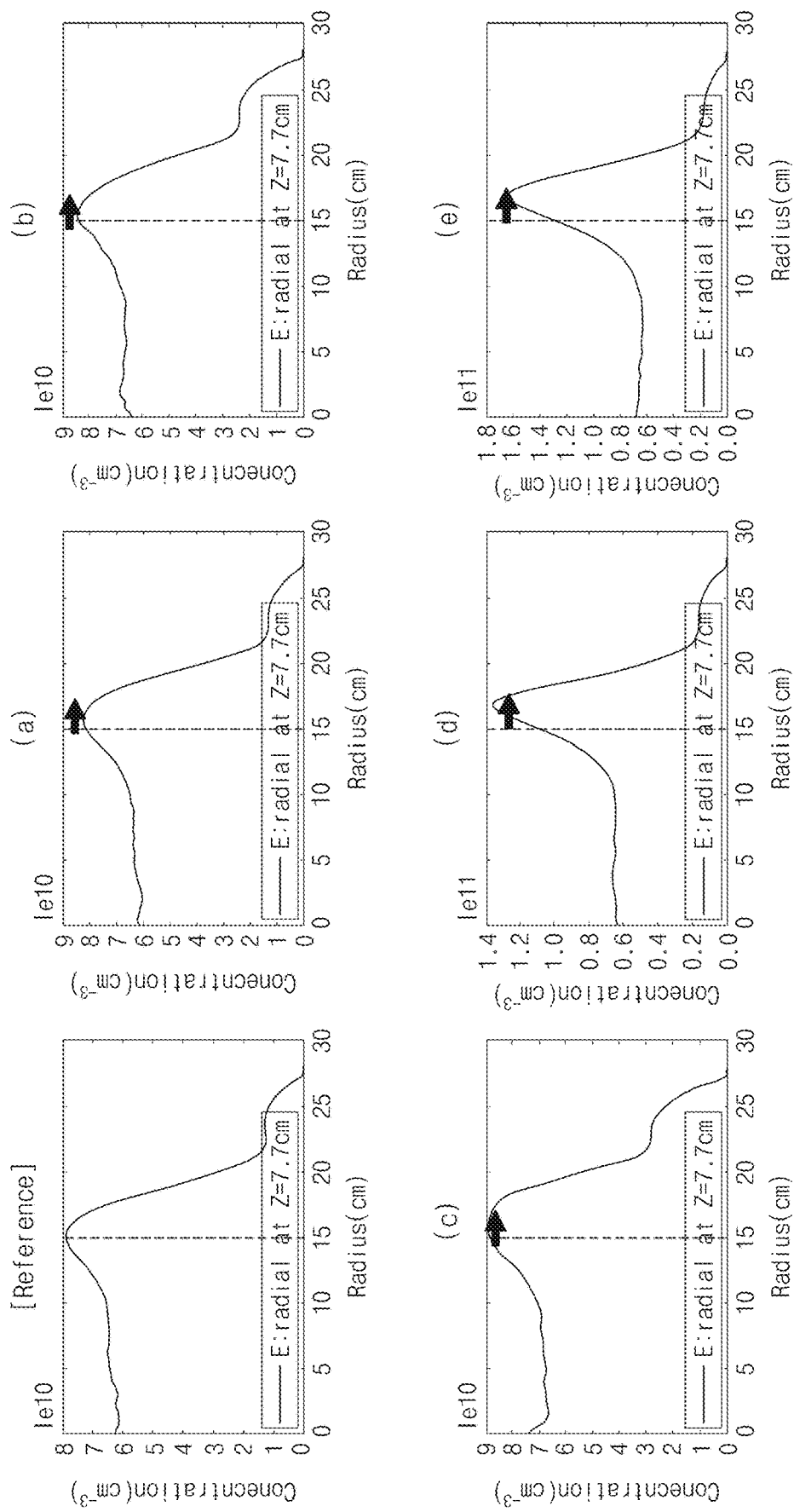
FIG. 10 is a graph illustrating a comparison of a generation position change of the high density plasma region according to the embodiments of FIGS. 4, 5B, 6B, 7A, and 8A.
Figure 11A:
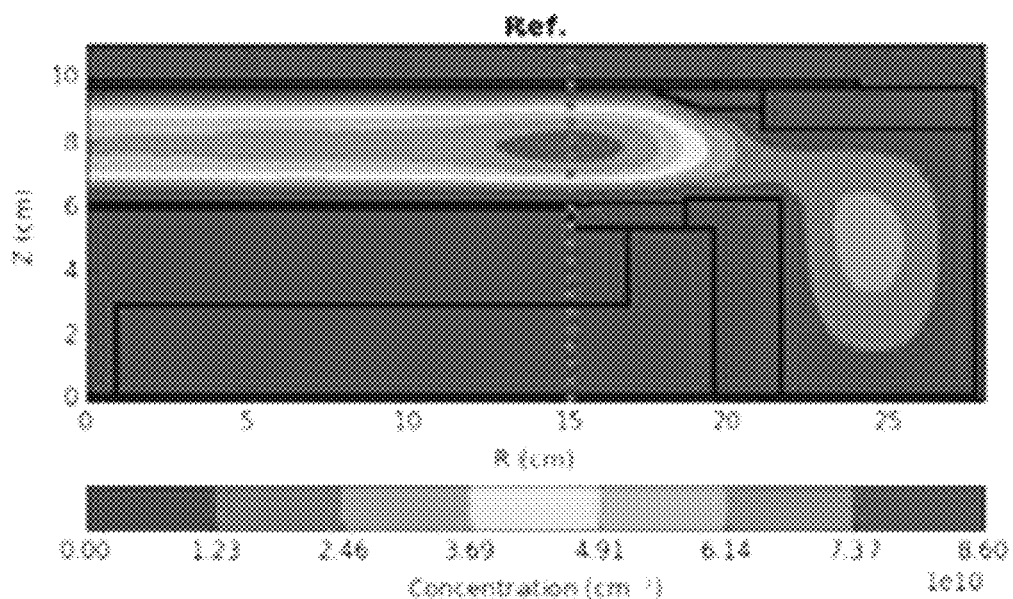
FIGS. 11A, 11B, and FIG. 11C are simulation results showing a plasma density distribution according to the conventional substrate processing apparatus and the exemplary embodiments of FIGS. 4, 5B, 6B, 7A, and 8A.
Figure 11A:
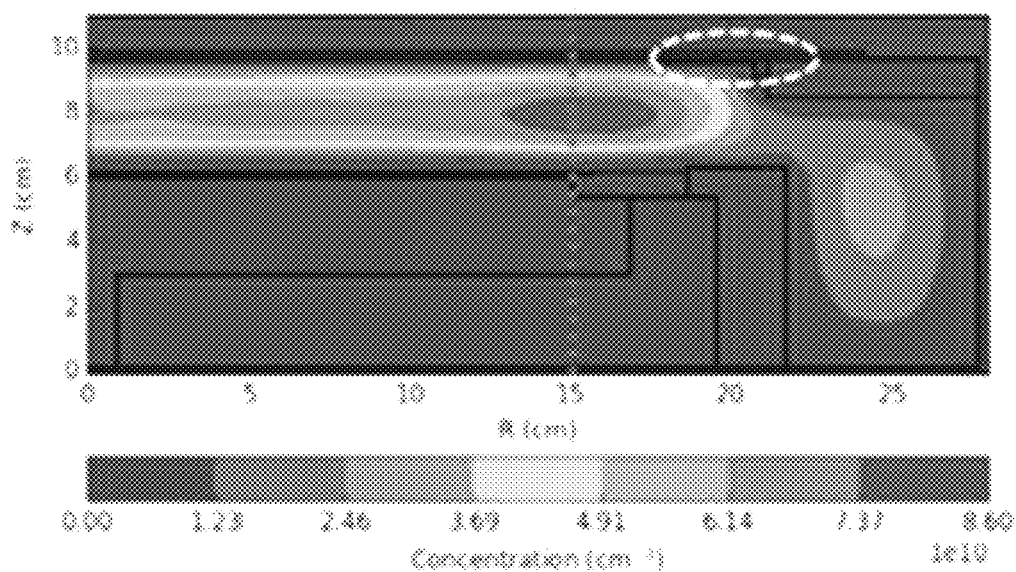
Figure 11B:
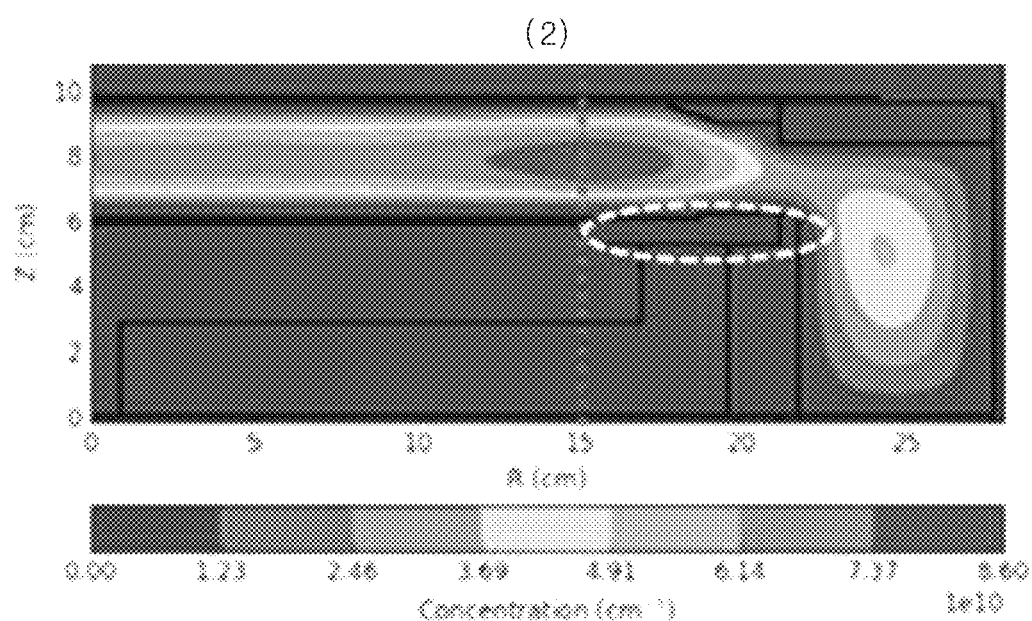
Figure 11B:
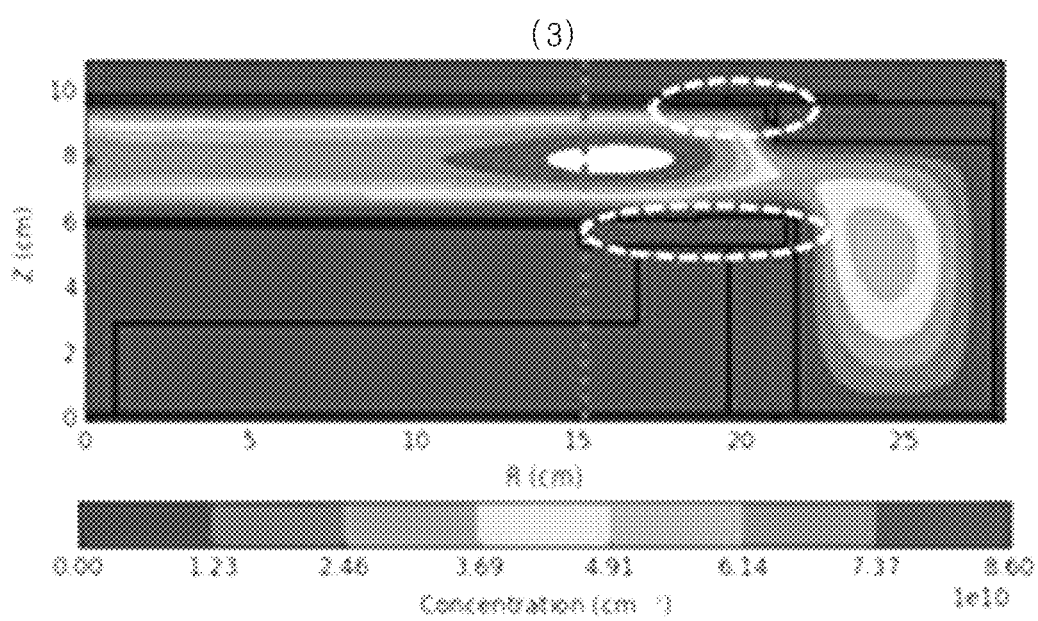
Figure 11C:
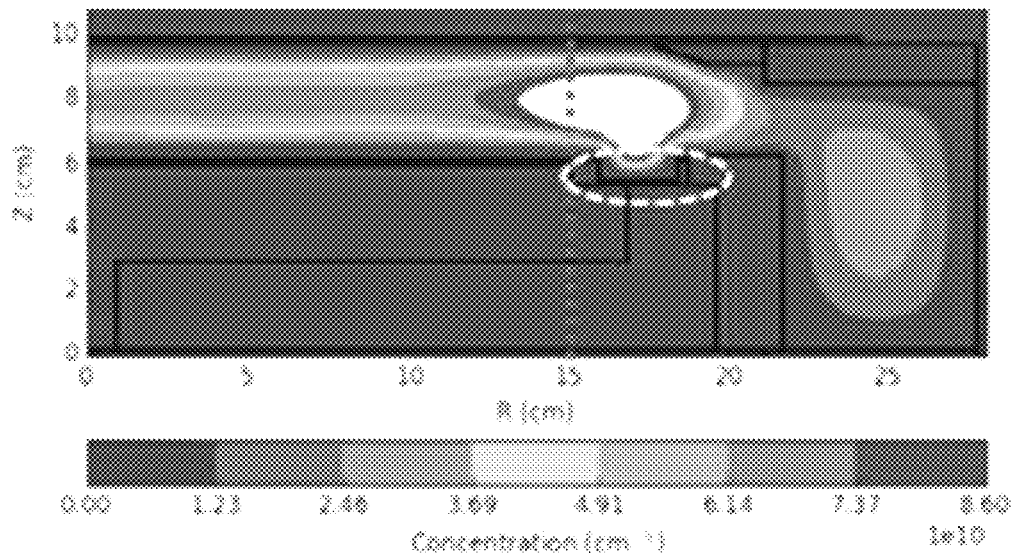
Figure 11C:
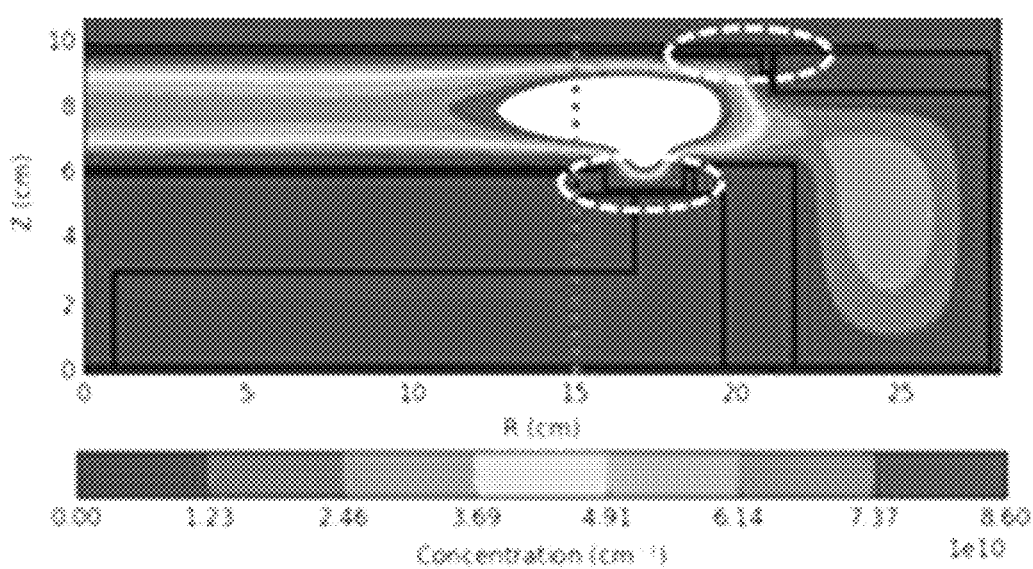

FIG. 10 is a graph illustrating a comparison of a generation position change of the high density plasma region according to the embodiments of FIGS. 4, 5B, 6B, 7A, and 8A. FIGS. 11A, 11B, and FIG. 11C are simulation results showing a plasma density distribution according to the conventional substrate processing apparatus and the exemplary embodiments of FIGS. 4, 5B, 6B, 7A, and 8A, respectively.

Reference of FIG. 10 and Reference of FIG. 11A illustrate a plasma density distribution of a conventional substrate processing apparatus. Chart (a) of FIG. 10 and distribution (1) FIG. 11A (1) illustrate plasma density distributions of the substrate processing apparatus of FIG. 4, chart (b) of FIG. 10 and distribution (2) of FIG. 11B illustrate plasma density distributions of the substrate processing apparatus of FIG. 5B, chart (c) of FIG. 10 and distribution (3) of FIG. 11b illustrate plasma density distributions of the substrate processing apparatus of FIG. 6B, chart (d) of FIG. 10 and distribution (4) of FIG. 11c illustrate plasma density distributions of the substrate processing apparatus of FIG. 7A, and chart (e) of FIG. 10 and distribution (5) of FIG. 11c illustrate the plasma density distributions of the substrate processing apparatus of FIG. 8A.

Referring to FIGS. 1, 4 to 8b, 10 and 11a to 11c, 1) when the protruding electrode 414 is absent 2) when the width of the focus ring 231 is expanded, 3) when the recessed recesses R are formed in the focus ring 231 along the circumferential direction of the focus ring 231, and/or 4) when the dielectric layer 221 has the thickness of 4 mm or less, the focus ring 231 includes the upper layer 231a of silicon (Si) and the lower layer 231b of alumina (Al1O3), and the ratio of the thicknesses of the upper layer 231a and the lower layer 231b is 4:1 to 3:2—for example, when the substrate processing apparatus 10 includes at least one of the configuration of 1) to 4)—it can be seen that the high density plasma region is formed such that the high density plasma deviates from the substrate edge region to the outside of the substrate W.

When the substrate processing apparatus 10 has the configuration of 1) or 2), the diffusion of the plasma is increased and the radius of the plasma is widened, so that the high density plasma may also be formed at a radius wider than the substrate W edge region.

When the substrate processing apparatus 10 has the configuration of 3) or 4), the impedance difference with respect to the high frequency power of the dielectric layer 221 and the focus ring 231 on the electrostatic chuck 220 is reduced, and the RF phase difference can be minimized. Accordingly, the phenomenon in which the plasma density increases in the edge region of the substrate W according to the RF phase difference can be reduced.

FIGS. 12A, 12B, 13A, 13B, 14A, and 14B are graphs illustrating impedance phases of a substrate and a focus ring with respect to high frequency power according to a thickness ratio of an upper layer and a lower layer of a focus ring in a substrate processing apparatus and simulation results illustrating plasma density distribution.

In the substrate processing apparatus according to exemplary embodiments of the inventive concept, a ratio of a thickness of an upper layer including silicon (Si) to a lower layer including alumina ($Al_2O_3$) of a focus ring may be 4:1 to 3:2 (that is, the thickness of the lower layer is 0.2 to 0.4 times a total thickness of the focus ring 231). At this time, resistivity of the focus ring may have approximately 100 Ω·cm. When the ratio of the thickness of the upper layer to the lower layer is 4:1 to 3:2, and the resistivity of the focus ring is approximately 100 Ω·cm, a difference in an impedance phase of a substrate and the focus ring with respect to high frequency power is minimized. As a result, plasma is not concentrated in an edge region of the substrate, and a uniform etching rate may appear in the entire region of the substrate, which can be confirmed through FIGS. 12A to 14B.

Figure 12A:
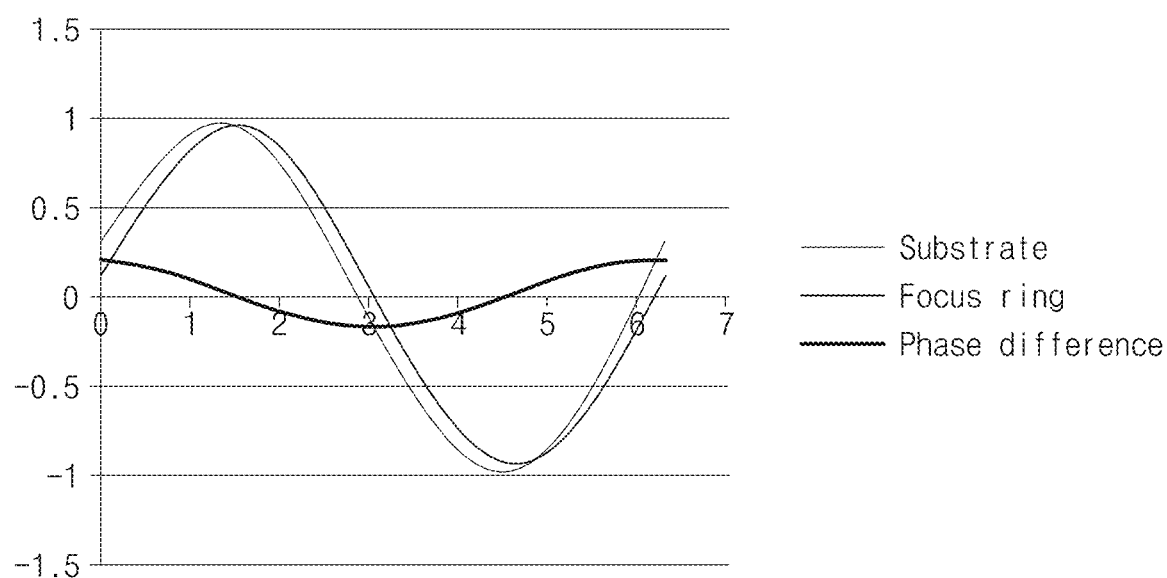
FIGS. 12A, 12B, 13A, 13B, 14A, and 14B are graphs illustrating impedance phases of a substrate and a focus ring with respect to high frequency power according to a thickness ratio of an upper layer and a lower layer of a focus ring in a substrate processing apparatus, and simulation results illustrating the plasma density distribution.
Figure 12B:
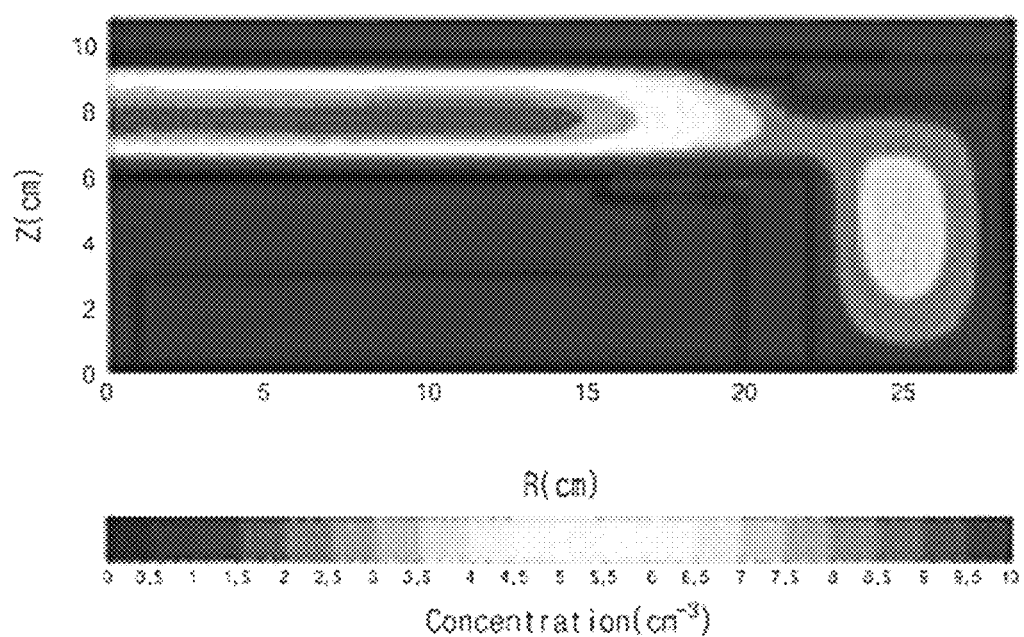
Figure 13A:
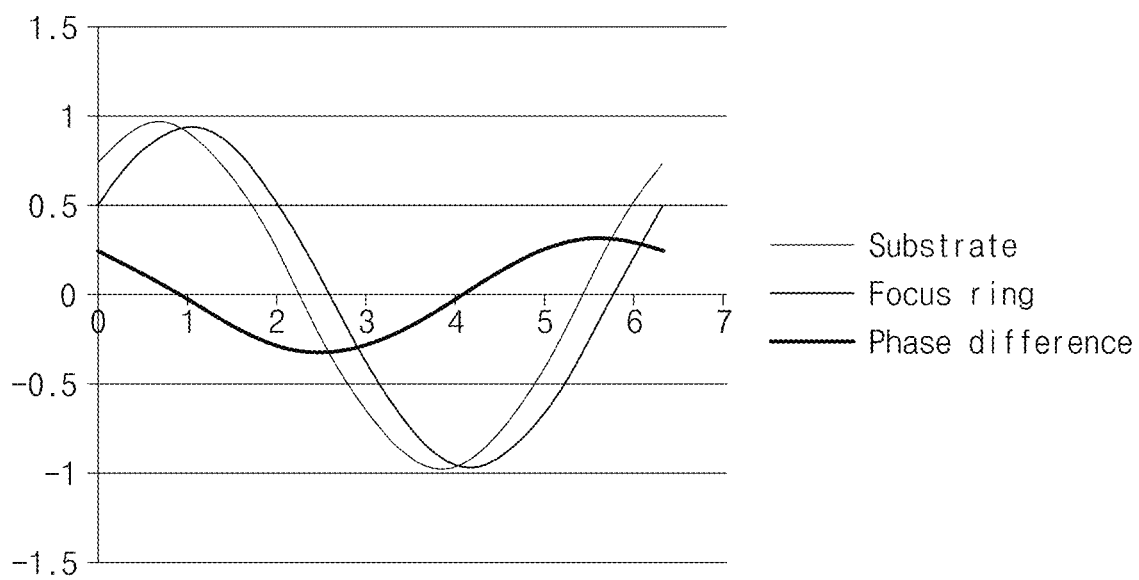
Figure 13B:
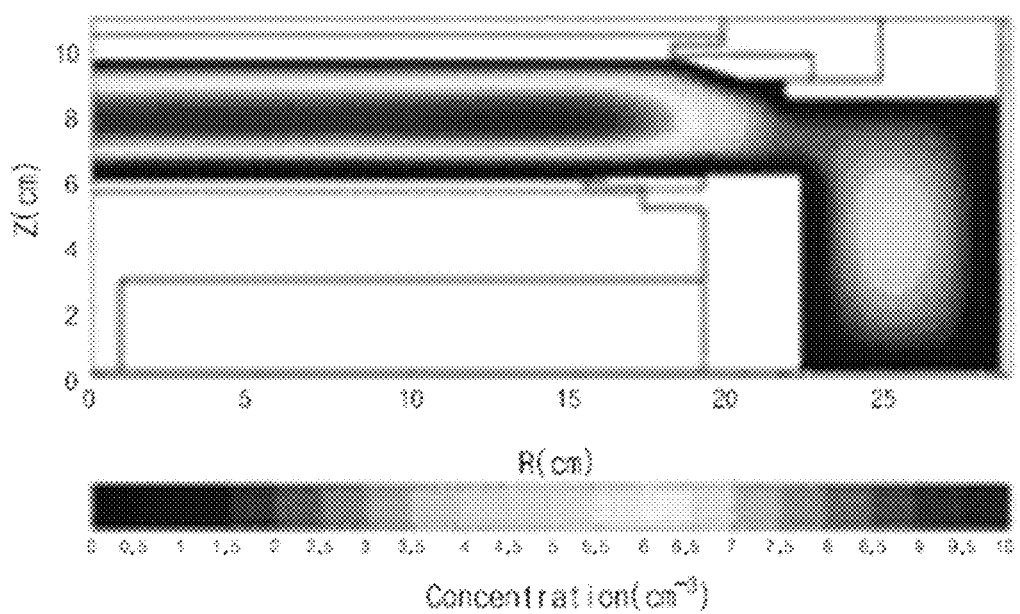
Figure 14A:
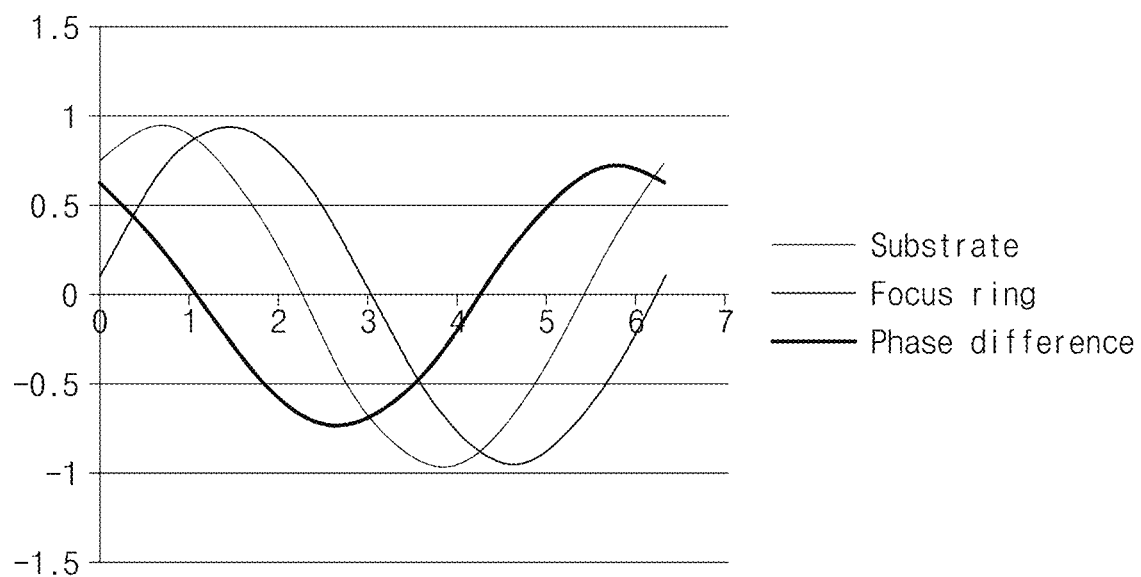
Figure 14B:
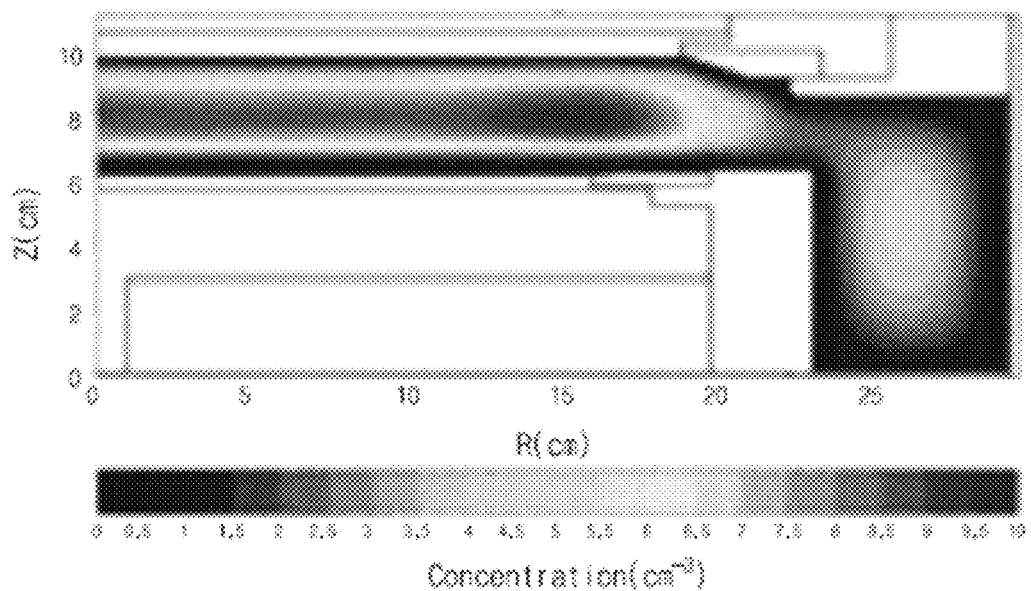

Specifically, in the substrate processing apparatus having the results of FIGS. 12A and 12B, a resistivity of a focus ring is 100 Ω·cm, a thickness of an upper layer containing silicon (Si) of the focus ring is 3 mm, and a thickness of a lower layer containing alumina ($Al_2O_3$) of the focus ring is 1 mm. In the substrate processing apparatus having the results of FIGS. 13A and 13B, resistivity of a focus ring is 100 Ω·cm, a thickness of an upper layer containing silicon (Si) of the focus ring is 3 mm, and a thickness of a lower layer containing alumina ($Al_2O_3$) of the focus ring is 2 mm. In the substrate processing apparatus having the results of FIGS. 14A and 14B, a thickness of an upper layer containing silicon (Si) of a focus ring is 4 mm, and a thickness of a lower layer containing alumina ($Al_2O_3$) is 1 mm. In FIGS. 12A and 13A, the phase difference between the substrate and the focus ring with respect to a high frequency power is smaller than that of FIG. 14A. Accordingly, it can be seen that the simulation results of FIGS. 12B and 13B have a relatively more uniform plasma density distribution than that of the simulation results of FIG. 14B. Still, the thickness ratio used for FIGS. 14A and 14B produces a more uniform plasma density distribution than for conventional focus rings that do not include any $Al_2O_3$ layer.

According to the exemplary embodiment of the inventive concept, a capacitively coupled plasma substrate processing apparatus may reduce the impedance difference with respect to the high frequency power of the electrostatic chuck on which the substrate is mountable and the focus ring disposed at the edge of the electrostatic chuck. As a result, a radius of plasma generated by the apparatus can be widened. A high density plasma region may be generated outside a substrate edge region to have a uniform etching rate throughout the substrate.

Terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Embodiments of the technical spirit of the inventive concept have been described above with reference to the accompanying drawings. However, it will be understood by those skilled in the art that various changes in form and details may be made therein without departing from the spirit and scope of the invention as defined by the appended claims. Therefore, the above embodiments are to be regarded as illustrative rather than restrictive.

What is claimed is:

1. A semiconductor substrate processing apparatus, comprising:
a housing enclosing a process chamber;
a plasma source unit connected to the housing, the plasma source unit including:
a shower head; and
a fixing ring positioned to support the shower head,
wherein the shower head includes an upper electrode and an electrode support on the upper electrode, the upper electrode and the electrode support being mounted on the fixing ring, and includes injection holes passing through part of the upper electrode and the electrode support and configured to inject gas into the chamber,
wherein the upper electrode includes an inner electrode that vertically overlaps with the electrode support and an outer electrode that does not vertically overlap with the electrode support, and
wherein the fixing ring supports the outer electrode and does not overlap the inner electrode;
an electrostatic chuck connected to the housing and including a lower electrode and a dielectric layer, the electrostatic chuck for mounting a semiconductor substrate thereon; and
a ring unit mounted on an edge portion of the electrostatic chuck, and including a focus ring and a cover ring surrounding the focus ring,
wherein:
one of the lower electrode and the upper electrode is connected to a high frequency power supply, and the other of the lower electrode and the upper electrode is connected to ground,
the focus ring has an inner side surface, and an opposite outer side surface that contacts the cover ring, and a width between the inner side surface and the outer side surface of the focus ring is a first width,
the cover ring has an inner side surface that contacts the outer side surface of the focus ring, and an outer side surface, and a width between the inner side surface and the outer side surface of the cover ring is a second width,
the first width is between 2 and 10 time the second width,
the cover ring has a size and positioning to have an outermost circumferential side surface that vertically overlaps the fixing ring from a top-down view,
the focus ring does not vertically overlap the fixing ring from the top-down view,
the focus ring has a two-layer structure that includes a doped silicon layer having a first thickness as an upper layer and an $Al_2O_3$ layer having a second thickness as a lower layer;
a top surface of the focus ring is coplanar with a top surface of the cover ring, and a bottom surface of the focus ring is coplanar with a bottom surface of the cover ring,
the dielectric layer has a third thickness,
the third thickness is at least 50% greater than the second thickness, and
the focus ring has a resistivity of about 100 Ω-cm.

2. The semiconductor substrate processing apparatus of claim 1, wherein:
the first width is between about 10% and about 15% of the diameter of the semiconductor substrate.

3. The semiconductor substrate processing apparatus of claim 1, wherein:
the fixing ring, focus ring, and cover ring are arranged to cause a peak plasma concentration during a plasma processing operation within the chamber to occur outside of an area, from a top-down view, covered by the semiconductor substrate when mounted.

4. The semiconductor substrate processing apparatus of claim 1, wherein:
the focus ring includes a recess formed in an upper surface thereof, outside of an area where the semiconductor substrate gets mounted.

5. The semiconductor substrate processing apparatus of claim 4, wherein:
the volume of the recess is between 0.25 and 4 times the volume of the material that forms the focus ring.

6. The semiconductor substrate processing apparatus of claim 4, wherein:
the upper electrode overlaps the focus ring and cover ring and overlaps a first region where the semiconductor substrate gets mounted, from a top-down view, and a bottom surface of the upper electrode where the upper electrode overlaps the focus ring and cover ring is coplanar with a bottom surface of the upper electrode where the upper electrode overlaps the first region.

7. The semiconductor substrate processing apparatus of claim 1, wherein:
the ratio of the first thickness to the second thickness is between 3:1 and 3:2.

8. The semiconductor substrate processing apparatus of claim 1, wherein:
the semiconductor substrate, when mounted on the electrostatic chuck, is mounted on the dielectric layer.

9. A semiconductor substrate processing apparatus, comprising:
a housing enclosing a process chamber;
a plasma source unit connected to the housing, the plasma source unit including:
a shower head; and
a fixing ring positioned to support the shower head,
wherein the shower head includes an upper electrode and an electrode support on the upper electrode, the upper electrode and the electrode support being mounted on the fixing ring, and includes injection holes passing through part of the upper electrode and configured to inject gas into the chamber,
wherein the upper electrode includes an inner electrode that vertically overlaps with the electrode support and an outer electrode that does not vertically overlap with the electrode support, and
wherein the fixing ring supports the outer electrode and does not overlap the inner electrode;
an electrostatic chuck connected to the housing and including a lower electrode, the electrostatic chuck for mounting a semiconductor substrate thereon; and
a ring unit mounted on an edge portion of the electrostatic chuck, and including a focus ring and a cover ring surrounding the focus ring,
wherein:
one of the lower electrode and the upper electrode is connected to a high frequency power supply, and the other of the lower electrode and the upper electrode is connected to ground,
the focus ring has a two-layer structure that includes a doped silicon layer as an upper layer having a first thickness and an $Al_2O_3$ layer as a lower layer having a second thickness,
the ratio of the first thickness to the second thickness is between 3:1 and 3:2, the cover ring has a size and positioning to have an outermost circumferential side surface that vertically overlaps the fixing ring from a top-down view, the focus ring does not vertically overlap the fixing ring from the top-down view, a top surface of the focus ring is coplanar with a top surface of the cover ring, and a bottom surface of the focus ring is coplanar with a bottom surface of the cover ring, the electrostatic chuck includes a dielectric layer mounted thereon, such that the semiconductor substrate, when mounted on the electrostatic chuck, is mounted on the dielectric layer, the dielectric layer having a third thickness greater than the second thickness, the third thickness is at least 50% greater than the second thickness, and the third thickness is 3 to 4 mm.

10. The semiconductor substrate processing apparatus of claim 9, wherein:

the focus ring has an inner side surface and an opposite outer side surface that contacts the cover ring, and a width between the inner side surface and the outer side surface of the focus ring is a first width;

the cover ring has an inner side surface that contacts the outer side surface of the focus ring, and an outer side surface, and a width between the inner side surface and the outer side surface of the cover ring is a second width;

the first width is between 2 and 10 time the second width; and the first width is between about 10% and about 15% of the diameter of the semiconductor substrate.

11. The semiconductor substrate processing apparatus of claim 9, wherein:

the fixing ring, focus ring, and cover ring are arranged to cause a peak plasma concentration during a plasma processing operation within the chamber to occur outside of an area, from a top-down view, covered by the semiconductor substrate when mounted.

12. The semiconductor substrate processing apparatus of claim 9, wherein:

the focus ring includes a recess formed in an upper surface thereof, outside of an area where the semiconductor substrate gets mounted.

13. The semiconductor substrate processing apparatus of claim 12, wherein:

the volume of the recess is between 0.25 and 4 times the volume of the material that forms the focus ring.

14. The semiconductor substrate processing apparatus of claim 12, wherein:

the upper electrode overlaps the focus ring and cover ring and overlaps a first region where the semiconductor substrate gets mounted, from a top-down view, and a bottom surface of the upper electrode where the upper electrode overlaps the focus ring and cover ring is coplanar with a bottom surface of the upper electrode where the upper electrode overlaps the first region.

* * * * *